(12) United States Patent
Karamcheti

(10) Patent No.: US 8,478,931 B1
(45) Date of Patent: *Jul. 2, 2013

(54) USING NON-VOLATILE MEMORY RESOURCES TO ENABLE A VIRTUAL BUFFER POOL FOR A DATABASE APPLICATION

(75) Inventor: Vijay Karamcheti, Los Altos, CA (US)

(73) Assignee: Virident Systems Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/465,790

(22) Filed: May 7, 2012

Related U.S. Application Data

(63) Continuation of application No. 12/505,386, filed on Jul. 17, 2009, now Pat. No. 8,176,233.

(60) Provisional application No. 61/081,658, filed on Jul. 17, 2008.

(51) Int. Cl.
*G06F 12/08* (2006.01)
(52) U.S. Cl.
USPC ............. 711/103; 710/56; 711/161; 711/170; 711/203

(58) Field of Classification Search
USPC ...................... 711/103, 161, 170, 203; 710/56
See application file for complete search history.

(56) References Cited

U.S. PATENT DOCUMENTS

| | | | | |
|---|---|---|---|---|
| 6,430,653 B1 * | 8/2002 | Fujikawa | ...................... | 711/113 |
| 2003/0233396 A1 * | 12/2003 | Wolfe, Jr. | ........................ | 709/200 |
| 2004/0117587 A1 * | 6/2004 | Arimilli et al. | ............... | 711/203 |

* cited by examiner

*Primary Examiner* — Jae Yu
(74) *Attorney, Agent, or Firm* — Fish & Richardson P.C.

(57) ABSTRACT

A buffer pool for a database application is maintained in a volatile main memory component. A control portion that corresponds to a block of application data residing on a non-volatile, asymmetric memory component and that includes a reference to a location of the block of application data on the non-volatile, asymmetric memory component is added to the buffer pool maintained in the volatile main memory component. The control portion from the buffer pool maintained in the volatile main memory component that corresponds to the block of application data is accessed and the location of the block of application data on the non-volatile, asymmetric memory component is identified. Based on identifying the location of the block of application data on the non-volatile, asymmetric memory component, the database application is enabled to access the block of application data directly from the non-volatile, asymmetric memory component.

19 Claims, 15 Drawing Sheets

USING NON-VOLATILE MEMORY RESOURCES TO ENABLE A VIRTUAL BUFFER POOL FOR A DATABASE APPLICATION

CROSS-REFERENCE TO RELATED APPLICATION

This application is a continuation of, and claims priority to, U.S. application Ser. No. 12/505,386, filed Jul. 17, 2009, which claims priority to U.S. Provisional Patent Application Ser. No. 61/081,658 entitled "Using Non-volatile Memory Resources as Part of a Virtual Buffer Pool" filed Jul. 17, 2008, which applications are incorporated herein by reference in their entireties.

TECHNICAL FIELD

This disclosure relates to using non-volatile memory resources to enable a virtual buffer pool for a database application.

BACKGROUND

Memory systems store data to be used by computers or other electronic devices. Various different memory systems may be used and accessed by computers or other electronic devices. For example, computers may use and access main memory as well as secondary storage such as, for example, hard disks and/or removable storage. Main memory is memory that is accessible to a central processing unit (CPU) of a computer or electronic device. Main memory is used to store data that is deemed likely to be actively used by the CPU. Main memory generally is volatile. Therefore, data stored in main memory generally is lost when the device is powered down.

Secondary storage generally is memory that is not directly accessible by a CPU of a computer or electronic device. Because secondary storage generally is not directly accessible by the CPU, the CPU may use input/output (I/O) channels to access secondary storage. In addition, the CPU may use intermediate areas in primary storage to effect data transfers between the CPU and secondary storage. Secondary storage generally is non-volatile. Therefore, data stored in secondary memory generally is not lost when the device is powered down.

SUMMARY

A buffer pool for a database application is maintained in a volatile main memory component. A control portion that corresponds to a block of application data residing on a non-volatile, asymmetric memory component and that includes a reference to a location of the block of application data on the non-volatile, asymmetric memory component is added to the buffer pool maintained in the volatile main memory component. The control portion from the buffer pool maintained in the volatile main memory component that corresponds to the block of application data is accessed and the location of the block of application data on the non-volatile, asymmetric memory component is identified. Based on identifying the location of the block of application data on the non-volatile, asymmetric memory component, the database application is enabled to access the block of application data directly from the non-volatile, asymmetric memory component.

The various aspects, implementations, and features disclosed may be implemented using, for example, one or more of a method, an apparatus, a system, tool, or processing device for performing a method, a program or other set of instructions, an apparatus that includes a program or a set of instructions, and a computer program stored on a tangible, computer-readable storage medium. The tangible, computer-readable storage medium may include, for example, instructions that, when executed, cause a computer to perform acts specified by the instructions.

The details of one or more implementations are set forth in the accompanying drawings and the description below. Other features will be apparent from the description and the drawings, and from the claims.

DETAILED DESCRIPTION

In a computer system that includes or has access to asymmetric, non-volatile memory components, a database application may store some or all of the contents of the database as blocks in the asymmetric, non-volatile memory components. This is facilitated by the non-volatile nature of these memory components and the fact that, in some implementations, the capacity of these asymmetric, non-volatile memory components may be sufficient to host all of or at least some desired subset of the database contents.

In order to facilitate access to the contents of the blocks of database data stored in the asymmetric, non-volatile memory component, a virtual buffer pool may be allocated in the computer system's symmetric, volatile main memory component. The virtual buffer pool in the computer system's symmetric, volatile main memory component may store control portions corresponding to the database blocks stored in the asymmetric, non-volatile memory component without also storing the actual corresponding database blocks that are stored in the symmetric, volatile main memory component. The control portions stored in the virtual buffer pool in the symmetric, volatile main memory component may include pointers to the locations of their corresponding database blocks on the asymmetric, non-volatile memory component that enable the database application to directly access the database blocks on the asymmetric, non-volatile, asymmetric memory without first having to be copied to the symmetric, volatile main memory component.

System Architecture: Hardware View

Figure 1:
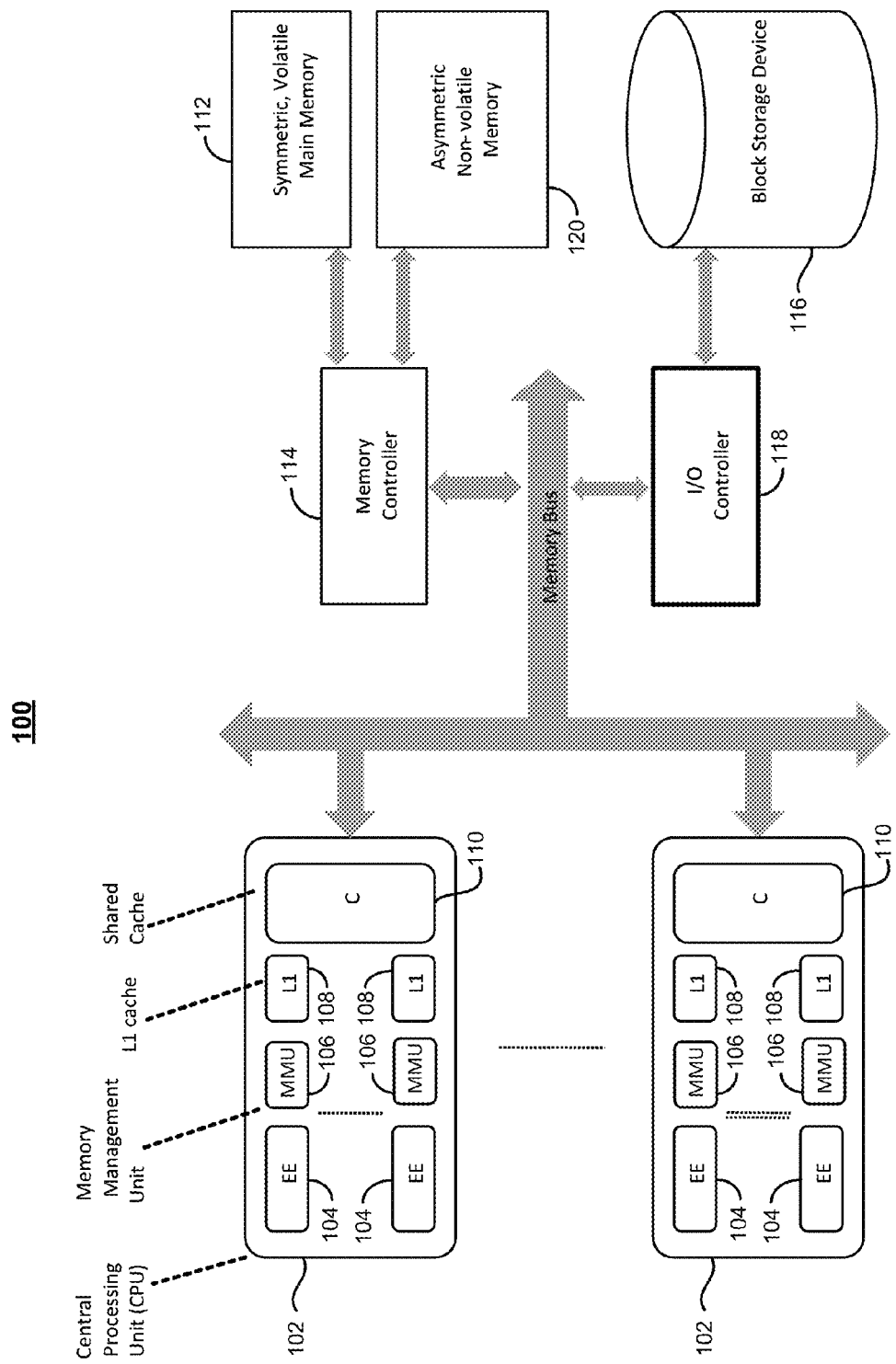
FIG. 1 is a block diagram of a hardware view of an example of a computer system.

FIG. 1 is a block diagram of a hardware view of a computer system (e.g., a server or a general purpose computer) 100. As illustrated in FIG. 1, computer system 100 includes processing components, memory components, and block storage components. More particularly, computer system 100 includes one or more processing components 102, which also may be referred to as central processing units (CPU). Each CPU 102 includes one or more execution engines 104, each of which includes or has access to a memory management unit (MMU) 106 and one or more levels of caches 108. Each CPU 102 may further include one or more levels of shared caches 110 shared across multiple execution units. In addition, computer system 100 includes or has access to a volatile main memory component 112. For example, the main memory component 112 may include a dynamic random access (DRAM) memory component. Volatile main memory components generally are randomly accessible by the execution engines 104 of the CPU 102 at a byte or word granularity, using machine instructions such as loads and stores via a memory controller component 114. Main memory components 112 generally exhibit symmetric access characteristics for read and write operations, incurring latencies that do not impede direct access by the execution engines 104.

Computer system 100 also includes or has access to a non-volatile block storage component 116, such as, for example, a conventional hard disk or a solid state storage (SSD) device. Non-volatile block storage components 116 generally retain information stored onto them even when computer system 100 is not powered on. Block storage components 116 may only be accessible using block read and write operations, where each operation involves one or more machine instructions interfacing with an I/O controller 118 to transfer information between the volatile main memory component 112 of the system 100 and the block storage component 116. Block read and write operations generally incur relatively long latencies that may be several orders of magnitude larger than the access times of volatile main memory components 112.

In addition, computer system 100 also includes or has access to an asymmetric, non-volatile, asymmetric memory component 120 that functions as a hybrid of a conventional main memory and a conventional hard disk. This non-volatile memory component 120 is referred to as asymmetric and may be said to function as a hybrid of a conventional main memory and a conventional hard disk because this non-volatile memory component 120 is configured to enable main memory-like random memory read operations and disk-like block write operations. The latencies incurred by the random memory read operations are substantially similar to those of the volatile main memory component 112, thereby enabling direct machine instruction-level access by the CPU execution engines 104 and supporting the use of non-volatile memory components, in some system configurations, as an augmentation or replacement of volatile main memory components 112. At the same time, the non-volatile nature of these memory components 120 and their ability in some cases to support disk-like storage capacities enables their use, in some system configurations, as an augmentation or replacement of non-volatile block storage components 116.

In some implementations, computer system 100 may use a common memory controller 114 to enable access to both the volatile main memory 112 and non-volatile asymmetric memory components 120. In other implementations, computer system 100 may use different memory controllers for the volatile main memory 112 and non-volatile asymmetric memory components 120. In some implementations, the non-volatile asymmetric memory component 120 may include NOR flash memory resources. Additionally or alternatively, the non-volatile asymmetric memory component 120 may include Phase Change Memory (PCM) resources.

System Architecture: Software View

Figure 2:
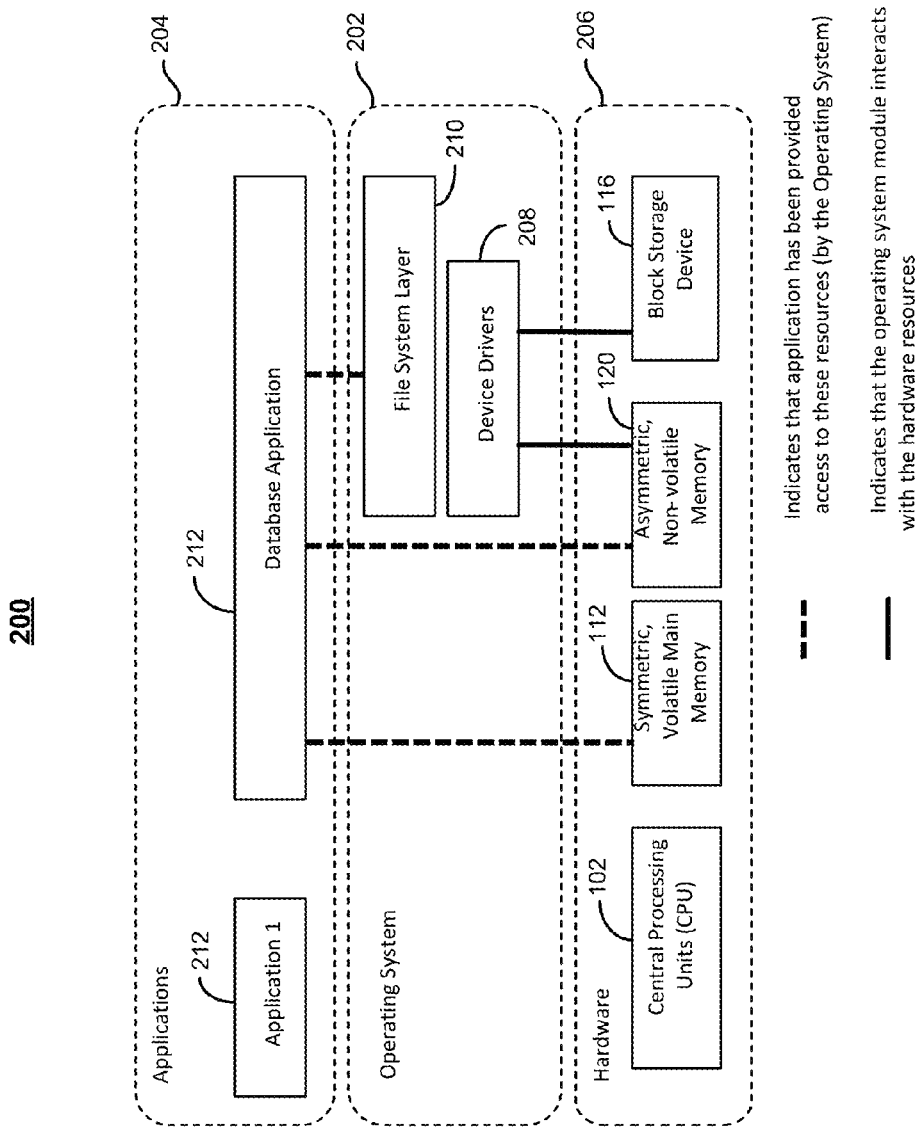
FIG. 2 is a block diagram of a software view of an example of a computer system.

FIG. 2 is a block diagram of a software view of the computer system 100 of FIG. 1. As illustrated in FIG. 2, computer system 100 includes multiple software layers, which interface with the hardware components described above in connection with FIG. 1 to provide desired functionality.

More particularly, the computer system 100 includes an Operating System (OS) software layer 202, one or more application software layers 204, and hardware components 206. The OS layer 202 closely interfaces with the hardware components 206 and includes one or more device driver modules 208 to interact with the hardware components 206 in the system 100. For example, the device driver component 208 associated with the block storage device 116 is responsible for issuing block read and write operations to the I/O controller 118 interfacing with the block storage device 116. Similarly, another device driver component 208 associated with the non-volatile asymmetric memory component 120 is responsible for issuing block write operations to the memory controller 114 interfacing with the non-volatile asymmetric memory component 120.

In addition, the OS layer 202 may include other modules, which enable higher-level software layers to work with a more convenient view of the hardware 206. For example, OS layer 202 may include a File System layer 210 that presents higher-level software layers with a more natural view of hardware block storage devices 116, where the hardware block storage devices 116 become repositories of structured sequences of information referred to as files. The File System layer 210 optionally also supports an organization mechanism for these files, using structures referred to as folders or directories. In such implementations, higher-level layers may perform operations against directories and files, and the File System layer 210 translates these operations into hardware component level operations. Such component-level operations may be carried out using the device driver modules 208.

Application software layers 204 above the OS layer 202 typically include one or more applications 212, which use the computer system's resources to perform one or more tasks. The OS layer 202 enables controlled sharing of the system's hardware resources 206 by one or more applications 212. Applications 212 perform their tasks using software programs, which include sequences of machine instructions that execute on the execution engines 104 of the system's CPUs 102 and that interact with memory and block storage hardware components either directly or via interfaces exposed by the OS layer 202.

Memory Addresses

Figure 3:
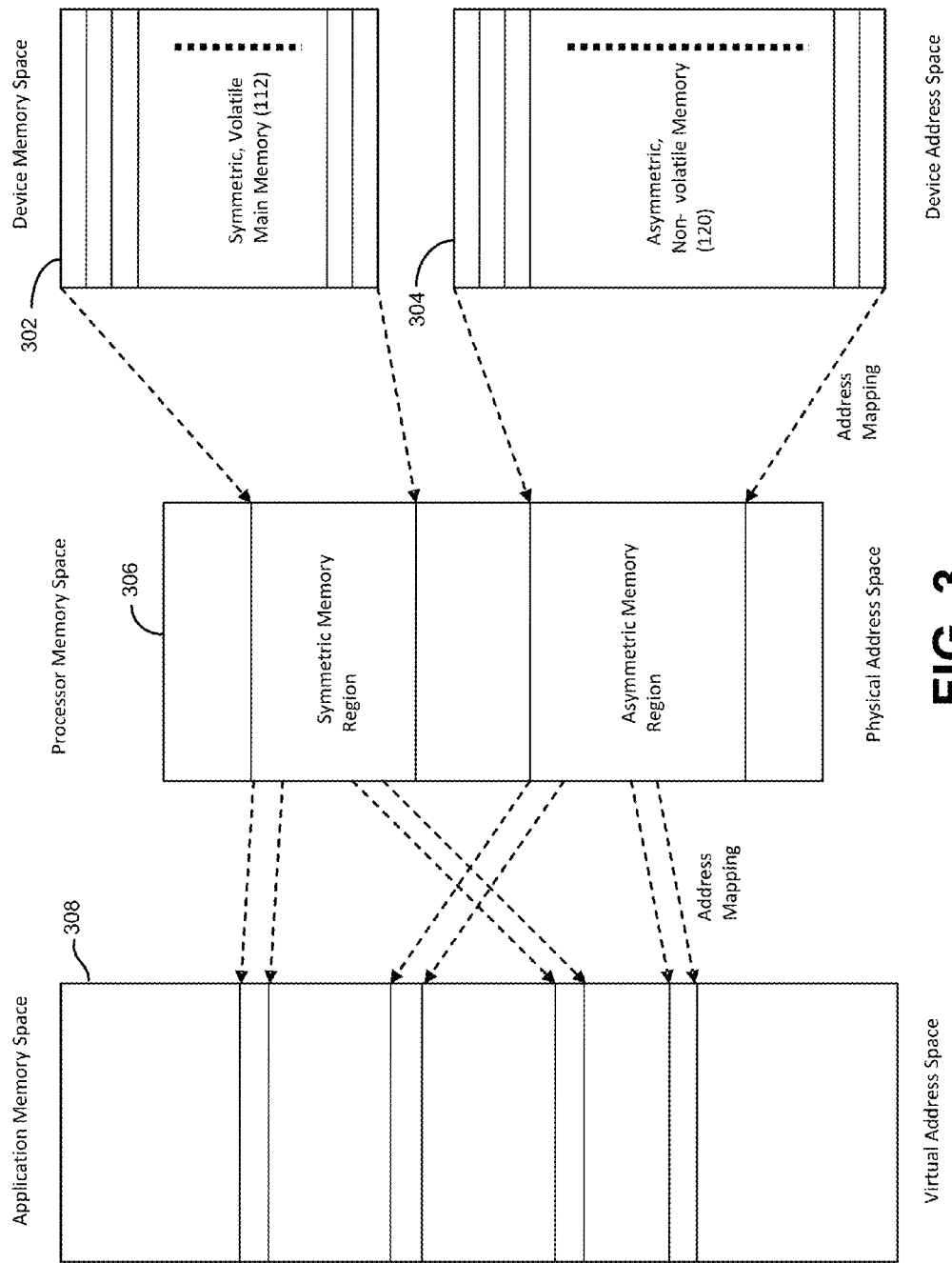
FIG. 3 is a block diagram of examples of different levels of memory address mappings supported by a computer system.

To coordinate and control access to memory resources by multiple applications, computer system 100 supports one or more levels of address mappings. FIG. 3 is a block diagram of examples of different levels of memory address mappings supported by computer system 100.

Individual memory components, such as, for example, volatile main memory component 112 or asymmetric, non-volatile memory component 120, each have their own device address spaces 302 and 304, respectively. The device address space for a particular memory component provides a component-specific label for the individual storage locations within the component. The device addresses of the device address spaces 302 and 304 for the different memory components are mapped into different regions in a system-wide processor memory space 306 defined by the CPUs 102 of computer system 100. Addresses in the processor memory space 306 may be referred to as physical memory addresses. Each application program executing on the CPU execution engines 104 works with an application-specific view of the memory space that may be referred to as the application memory space 308. Addresses in the application memory space 308 may be referred to as virtual memory addresses.

The OS layer allocates system-wide memory resources to application programs by establishing mappings between the physical memory addresses of the CPU's physical address space 306 and the application's virtual memory addresses of the virtual address space 308. Machine instructions issued by a software program refer to the virtual memory addresses of the software program's virtual address space 308. Such machine instructions referencing the virtual memory addresses of virtual address space 308 are translated into corresponding physical addresses by the CPU memory management units 106 after the memory management units have been appropriately configured by the OS layer 202.

Memory controller components 114 then translate the physical addresses of the physical address space 306 into corresponding device addresses in the device address spaces 302 and 304 of the volatile main memory component 112 and the asymmetric, non-volatile memory component 120.

The mapping of different types of memory device addresses into the system-wide physical address space 306 permits the execution engines 104 to uniformly access the memory device addresses—independent of which device is responsible for which range of addresses. Specifically, the mapping of different memory device addresses into the system-wide physical address space 306 enables the CPU execution engines 104 to perform random read accesses to both volatile main memory component 112 and asymmetric, non-volatile memory components 120 in a uniform fashion.

The OS layer 202 also provides a mechanism called memory-mapped I/O, which permits portions of the block storage devices 116 to be mapped into an application's virtual address space. Accesses to these virtual addresses that are mapped to portions of the block storage devices 116 are trapped by the OS layer 202, which satisfies the access by performing necessary block read or write operations on behalf of the requesting application.

The memory mapping mechanism generally is exposed using special OS interfaces. For example, most Unix-based OS layers (e.g., Linux, FreeBSD, Solaris, etc.) support an mmap system call, which enables applications to request that portions of individual files be mapped into their virtual address space.

Database Application: Structure

A database application enables structured storage, indexing, and retrieval of large amounts of information. The information stored and accessed by a database application may be referred to as a database. The contents of a database may include one or more files that may be stored, for example, on a computer system's block storage components using the computer system's File System layer. Storing these files on a non-volatile component may enable both a larger volume of information to be stored than otherwise may be available from a volatile main memory component as well as a consistent and durable view of the database's contents in the presence of concurrent read and write operations against the database.

Database files may be organized as collections of fixed size blocks that range, for example, from a few kilobytes to several tens of kilobytes. These blocks may store various data structures accessed by database applications, ranging, for example, from structured records making up the contents of the database to indexing structures used for efficiently searching for and accessing individual records stored in the database.

To efficiently support a variety of read and write queries against a database, a database application may carefully manage its use of the system hardware resources, including, for example, the volatile main memory resources and the non-volatile block storage resources, each of which may be managed by a specific and dedicated module within the database application.

Figure 4:
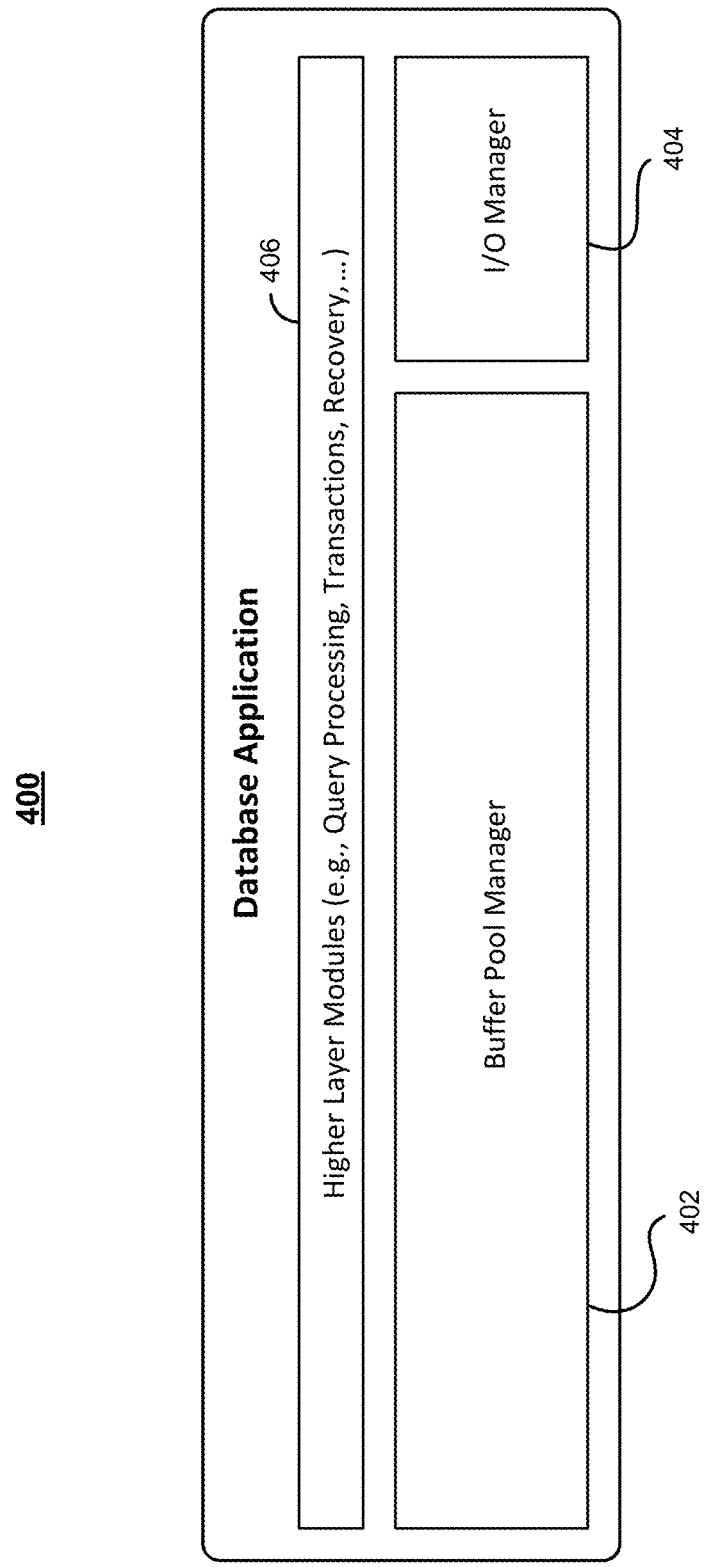
FIG. 4 is a block diagram of an example of a database application.

FIG. 4 is a block diagram of a database application 400. As illustrated in FIG. 4, database application 400 includes a buffer pool manager module 402 for managing the use of volatile main memory resources and an I/O manager module 404 for managing interactions with the File System layer. In addition, database application 400 also includes higher layer modules 406 including, for example, a query processing module, a transactions module, and/or a recovery module. Such higher layer modules 406 of database application 400 may request the buffer pool manager 402 for access to a database block, and the buffer pool manager 402 may service the access request directly or, alternatively, the buffer pool manager 402 optionally may interact with the I/O manager 404 to satisfy the request.

Database Application: Buffer Pool Operation

In some implementations, a symmetric, volatile main memory component may maintain a buffer pool to permit a database application to directly access the contents of a database using machine instructions. In such implementations, the buffer pool may be organized as a set of fixed size buffers in the symmetric, volatile main memory component that are allocated by the OS layer in one or more batches during the operation of the database application. The buffer pool manager of the database application may use these buffers to temporarily store copies of database blocks in the systems' symmetric, volatile main memory component to enable the copies of the database blocks to be accessed by other modules in the database application. The physical memory resources allocated by the OS layer to the database application are mapped into the database application's virtual address space, permitting their direct access using machine instructions.

Figure 5A:
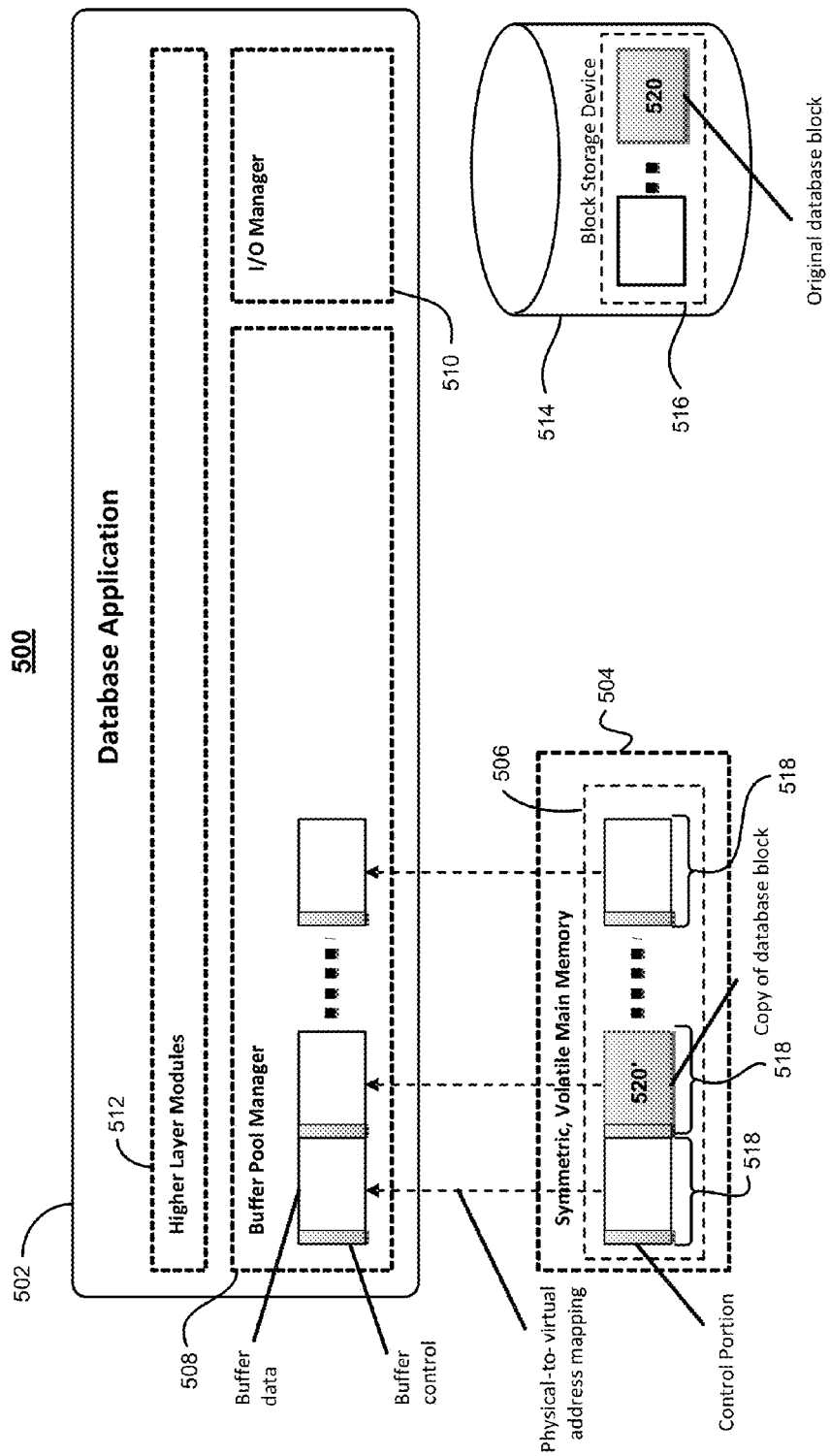
FIGS. 5A and 5D are block diagrams of an example of a computer system running a database application in which a buffer pool is maintained in the computer system's symmetric, volatile main memory component.

FIG. 5A is a block diagram of an example of a computer system 500 running a database application 502 in which the computer system's symmetric, volatile main memory component 504 is being used to maintain a buffer pool 506.

As illustrated in FIG. 5A, the database application 502 includes a buffer pool manager 508, an I/O manager 510, and one or more higher layers 512 that include other database application modules. Computer system 500 includes symmetric, volatile main memory component 504 and a block storage device 514 on which the database 516 is stored. In addition, in order to enable modules in the database application 502 to access the contents of the database 516, the computer system's symmetric, volatile main memory component 504 maintains a buffer pool 506.

The buffer pool 506 includes a number of individual buffers 518, each of which temporarily stores or is allocated to temporarily store copies of database blocks that reside on the block storage device 514. For example, as illustrated in FIG. 5A, database block 520 is stored on block storage device 514, and a copy 520' of database block 520 is temporarily stored in buffer pool 506. In addition to storing or being allocated to store a copy of a database block, each buffer 518 in buffer pool 506 also includes or is allocated to include a control portion that stores information about the copy of the database block stored in the buffer 518.

Figure 5B:
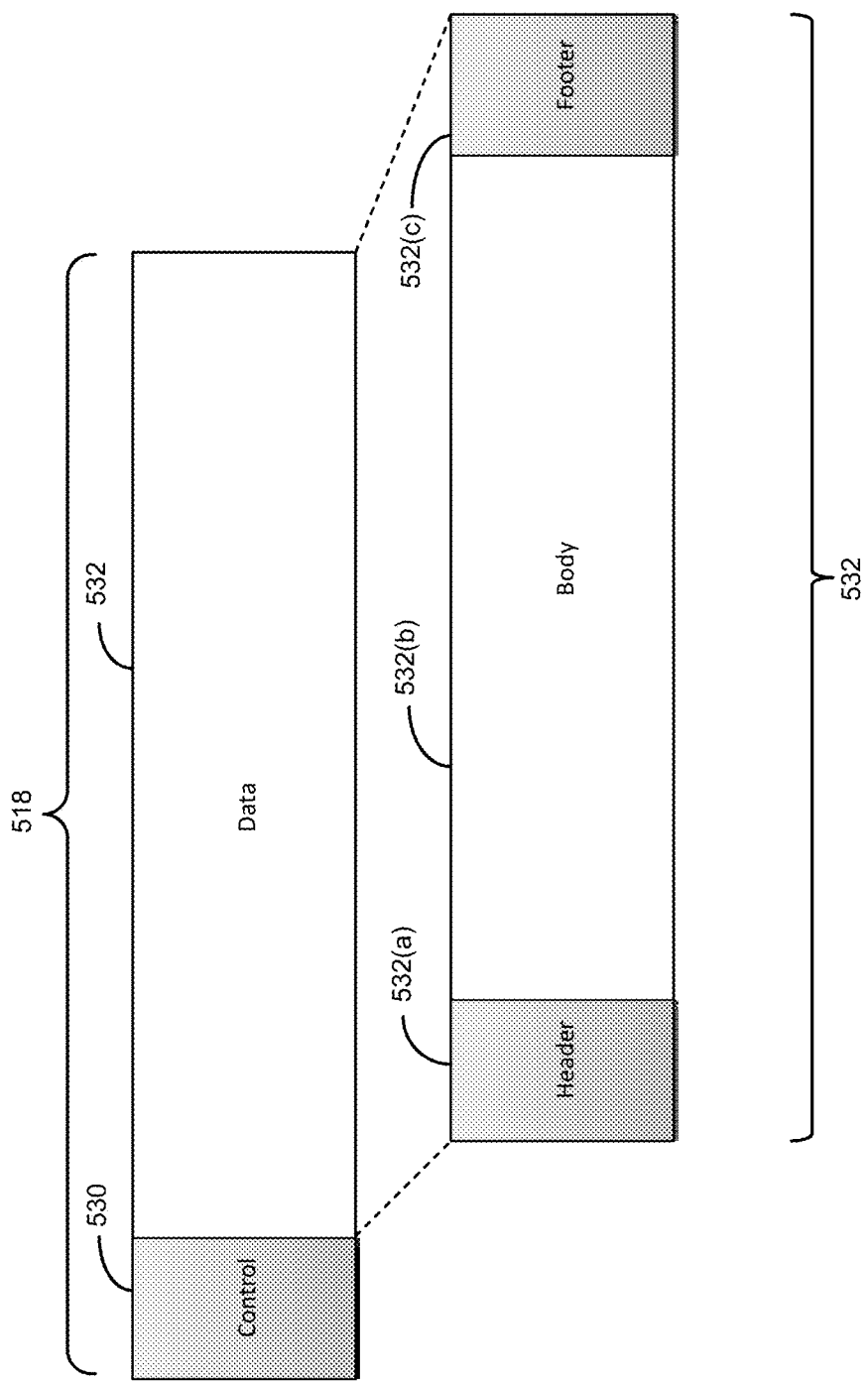
FIG. 5B is a block diagram of an example of an individual buffer from a buffer pool.

FIG. 5B is a block diagram of an example of an individual buffer 518 from the buffer pool (not illustrated). As illustrated in FIG. 5B, buffer 518 includes a control portion 530 and a data portion 532. The data portion 532 is a copy of a database block that resides on the computer system's block storage device and is further organized into a header portion 532(*a*), a body portion 532(*b*), and a footer portion 532(*c*). In some implementations, header portion 532(*a*) may store information about the type of the database block 532 and/or one or more index structures for the database block 532, body portion 532(*b*) may store one or more records and/or one or more log entries, and footer portion 532(*c*) may store one or more index structures for the database block 532 and/or free space information for the database block 532. Meanwhile, control portion 530 of buffer 518 stores information about the database block 532 currently residing in the buffer's data portion 532, such as, for example, a database block identifier (ID) for the database block. In addition, control portion 532 may include other fields such as lock objects used for synchronization, reference counts, and status flags, which may be used by the buffer pool manager and other database modules accessing the buffer.

In some implementations, the control 530 and data portions 532 of a buffer 518 are allocated as two contiguous ranges of virtual addresses, where every control portion is associated with a unique data portion and vice-versa. This design may enable efficient responses to common queries that a buffer pool manager frequently performs as part of its operation— for example, given a control portion, find the associated data portion and the reverse.

Referring again to FIG. 5A, the buffer pool manager module 508 of database application 502 manages a collection of volatile main memory resources and services requests to access database blocks issued by other higher layer modules 512 of database application 502. More particularly, the other higher layer modules 512 of database application 502 perform random direct memory accesses to database blocks, and the buffer pool manager 508 is responsible for ensuring that database blocks that are not already present in the buffer pool 506 are brought into the buffer pool 506 when requested by the other higher layer modules 512. To copy a database block from block storage device 514 to a buffer in the symmetric, volatile main memory component 504, the buffer pool manager 508 interacts with the I/O manager 510 to issue I/O requests to retrieve appropriate database blocks from block storage device 514, as described further below in connection with FIGS. 5C and 5D.

In some implementations, buffer pool 506 may be managed as a cache. In such implementations, the buffer pool manager 508 may need to evict the current contents of a buffer 518 before using the buffer 518 to store the contents of a new database block. Depending on whether or not any modifications are pending on the database block to be evicted by the buffer pool manager 508, additional I/O requests may be issued via the I/O manager 510 to update the state of the database block on the non-volatile block storage components 514 before the database block is evicted from the buffer 518.

Figure 5C:
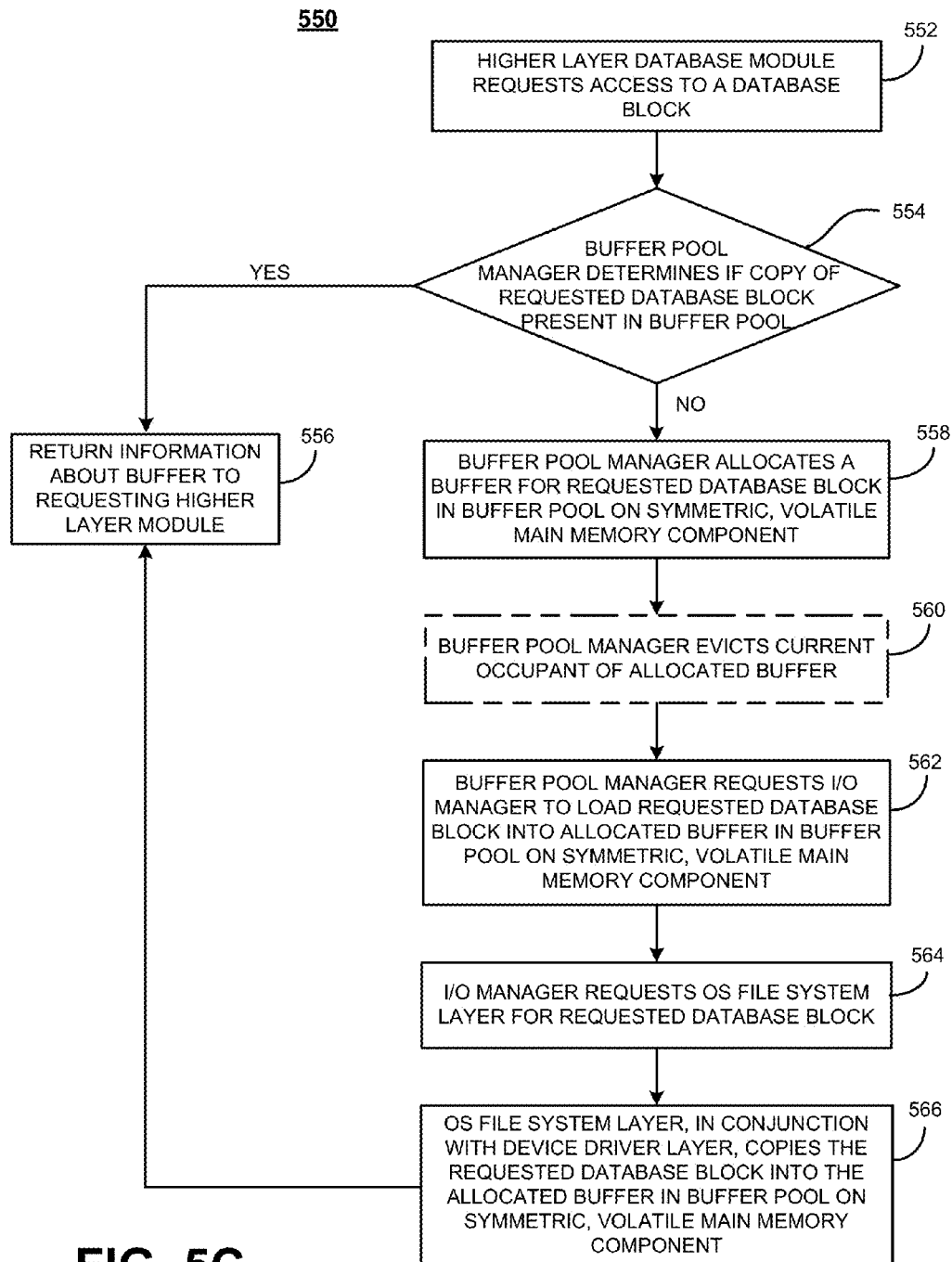
FIG. 5C is a flowchart of an example of a process through which a computer system services a request by a database module to access a database block.
Figure 5D:
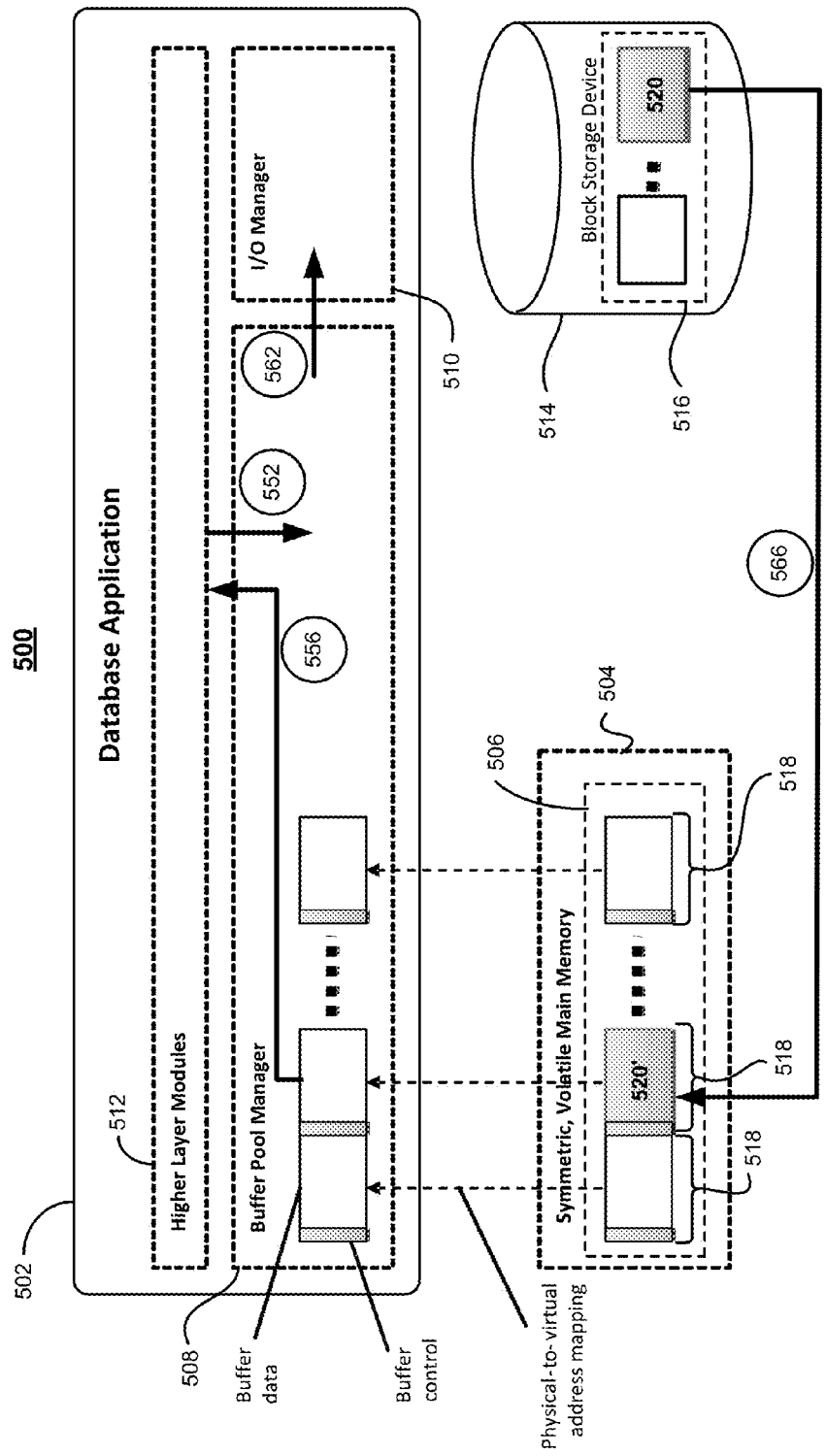

FIG. 5C is a flowchart 550 of an example of a process through which a computer system services a request by a database module to access a database block. FIG. 5D is a block diagram of the computer system 500 of FIG. 5A that illustrates pictorially how different components of the computer system 500 interact to perform the process of FIG. 5C.

The process begins when a higher layer database module 512 requests access to a database block (552). In some implementations, the higher layer module 512 may reference the database block to which it is requesting access by database block ID. In response to receiving the request to access the database block, the buffer pool manager 508 checks the internal state of the buffer pool 506 to determine if a copy of the requested database block already is present in one of the buffers 518. In implementations where the higher layer module 512 references the requested database block by database block ID, the buffer pool manager 508 determines if a copy of the database block corresponding to the database block ID is present in one of the buffers 518.

If a copy of the requested database block already is present in buffer pool 506, the buffer pool manager 508 returns information about the buffer 518 within which the copy of the requested database block is stored to the requesting higher layer database module 512 (556), thereby enabling the requesting higher layer database module 512 to directly access the copy of the requested database block from the symmetric volatile main memory component 504. For example, the buffer pool manager 508 may return, to the requesting higher layer module 512, a pointer to the virtual address in the database application's address space that corresponds to the physical address of the buffer 518 on the symmetric, main memory component 504 in which the copy of the requested database block is stored. In some implementations, this pointer may be stored in the control portion of the buffer 518 within which the copy of requested database block is stored. In such implementations, the buffer pool manager 508 may access this pointer by accessing the control portion of the buffer 518 within which the copy of the requested database block is stored.

If a copy of the requested database block is not already present in buffer pool 506, the buffer pool manager 508 allocates a buffer 518 for the requested database block in buffer pool 506 on symmetric, volatile main memory component 504 (558), potentially evicting the current occupant of the allocated buffer 518 if the allocated buffer 518 is currently occupied (560). In addition, the buffer pool manager 508 also requests the I/O manager module 510 to load the requested database block into the allocated buffer 518 in buffer pool 506 on symmetric, volatile main memory component 504 (562). In response, the I/O manager module 510 requests the OS File System layer for the requested database block (564). Thereafter, the OS File System layer in conjunction with the device driver layer copies the requested database block from the non-volatile block storage device 514 into the allocated buffer 518 in buffer pool 506 on symmetric, volatile main memory component 504. Upon notification of the completion of the transfer of the requested database block into the allocated buffer 518, the buffer pool manager 508 returns information about the buffer 518 within which the copy of the requested database block is now stored (556) and returns control to the higher layer database module 512 that made the original request. This higher layer requesting module 512 then can access the contents of the requested database block, which have been copied into the buffer pool 506, using software machine instructions to directly access random byte- or word-level locations within the buffer 518 using the virtual addresses associated with these locations.

Database Application: Virtual Buffer Pool Operation

The availability of asymmetric, non-volatile memory components in a computer system enables an alternative approach to implementing the buffer pool 506 described above in connection with FIGS. 5A-5D.

In a computer system that includes or has access to asymmetric, non-volatile memory components, a database application can store some or all of the contents of the database as blocks in the asymmetric, non-volatile memory components. This is facilitated by the non-volatile nature of these memory components and the fact that, in some implementations, the capacity of these asymmetric, non-volatile memory components may be sufficient to host all of or at least some desired subset of the database contents. In implementations where only a subset of the contents of the database are stored in the asymmetric, non-volatile memory components, the choice of which database blocks reside in an asymmetric, non-volatile memory component and which database blocks reside in other non-volatile block storage components may be based on a number of factors including, for example, the frequency with which different database blocks are accessed and the types of queries that have been performed on the database.

In order to facilitate access to the contents of the blocks of database data stored in the asymmetric, non-volatile memory component, the database application may utilize the buffer pool concept described above in connection with FIGS. 5A-5D. In such cases, the buffer pool manager responds to requests from database application modules in the fashion described above in connection with FIGS. 5A-5D, using the I/O manager to perform block read and write operations against the non-volatile asymmetric memory component, via the File System layer and the device driver modules in the OS layer, to copy database blocks to/from the buffer pool. However, the main memory-like random memory read operations supported by the non-volatile, asymmetric memory components facilitate alternatives to the buffer pool concept described above in connection with FIGS. 5A-5D.

In particular, in a computer system that includes or has access to asymmetric, non-volatile memory components that store at least a subset of the contents of a database, instead of utilizing a buffer pool structure as described above in connection with FIGS. 5A-5D to access all of the database blocks stored in the asymmetric, non-volatile memory components, at least some of the database blocks stored in the asymmetric, non-volatile memory components may be accessed directly using machine instructions from the asymmetric, non-volatile memory components without first copying the database blocks into a buffer pool in the computer system's symmetric, volatile main memory component. Rather, a distinguished region may be allocated in the symmetric, volatile main memory component for storing control portions corresponding to database blocks stored in the asymmetric, non-volatile memory component without also storing the actual corresponding database blocks in the symmetric, volatile main memory component. In such an implementation, the control portions stored in the distinguished region of the symmetric, volatile main memory component include pointers to the locations of their corresponding database blocks on the asymmetric, non-volatile memory component that enable the database blocks on the asymmetric, non-volatile, asymmetric memory component to be accessed directly without first copying the database blocks from the asymmetric, non-volatile memory component to the symmetric, volatile main memory component.

The distinguished region in the symmetric, volatile main memory component that stores control portions corresponding to the database blocks stored in the asymmetric, non-volatile memory component without also storing the actual corresponding database blocks may be referred to as a virtual buffer pool because the database blocks are not actually copied to buffers allocated in the symmetric, volatile main memory component.

Figure 6A:
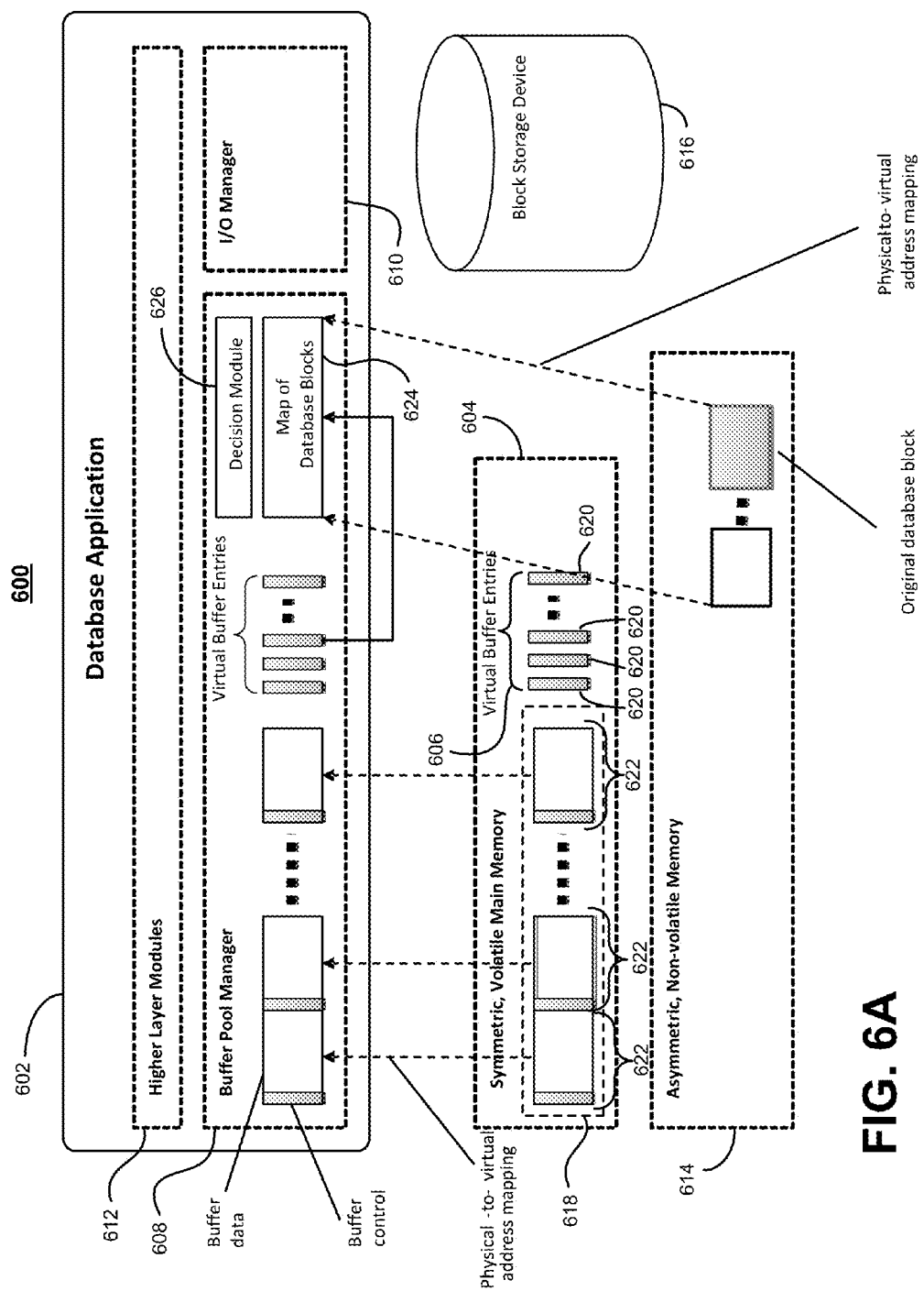
FIGS. 6A and 6D are block diagrams of an example of a computer system running a database application in which a virtual buffer pool is maintained in the computer system's symmetric, volatile main memory component.

FIG. 6A is a block diagram of an example of a computer system 600 running a database application 602 in which the computer system's symmetric, volatile main memory component 604 is being used to maintain a virtual buffer pool 606.

As illustrated in FIG. 6A, the database application 602 includes a buffer pool manager 608, an I/O manager 610, and one or more higher layers 612 that include other database application modules. Computer system 600 includes symmetric, volatile main memory component 604, asymmetric, non-volatile memory component 614, and a block storage device 616. In some implementations, the entire contents of the database may be stored on asymmetric, non-volatile memory component 614, while, in other implementations, the contents of the database may be distributed across both asymmetric, non-volatile memory component 614 and block storage device 616. In addition, in order to facilitate access to the contents of the database by higher layer modules 612 in the database application 602, the computer system's symmetric, volatile main memory component 604 maintains a virtual buffer pool 606 and a buffer pool 618.

Virtual buffer pool 606 includes a number of individual blocks 620, each of which temporarily stores or is allocated to temporarily store a control portion for a corresponding database block that resides on asymmetric, non-volatile memory component 614. Among other information, control portion 630 includes a pointer to the virtual address that has been mapped to the physical address of its corresponding database block on the asymmetric, non-volatile memory component 614.

Figure 6B:
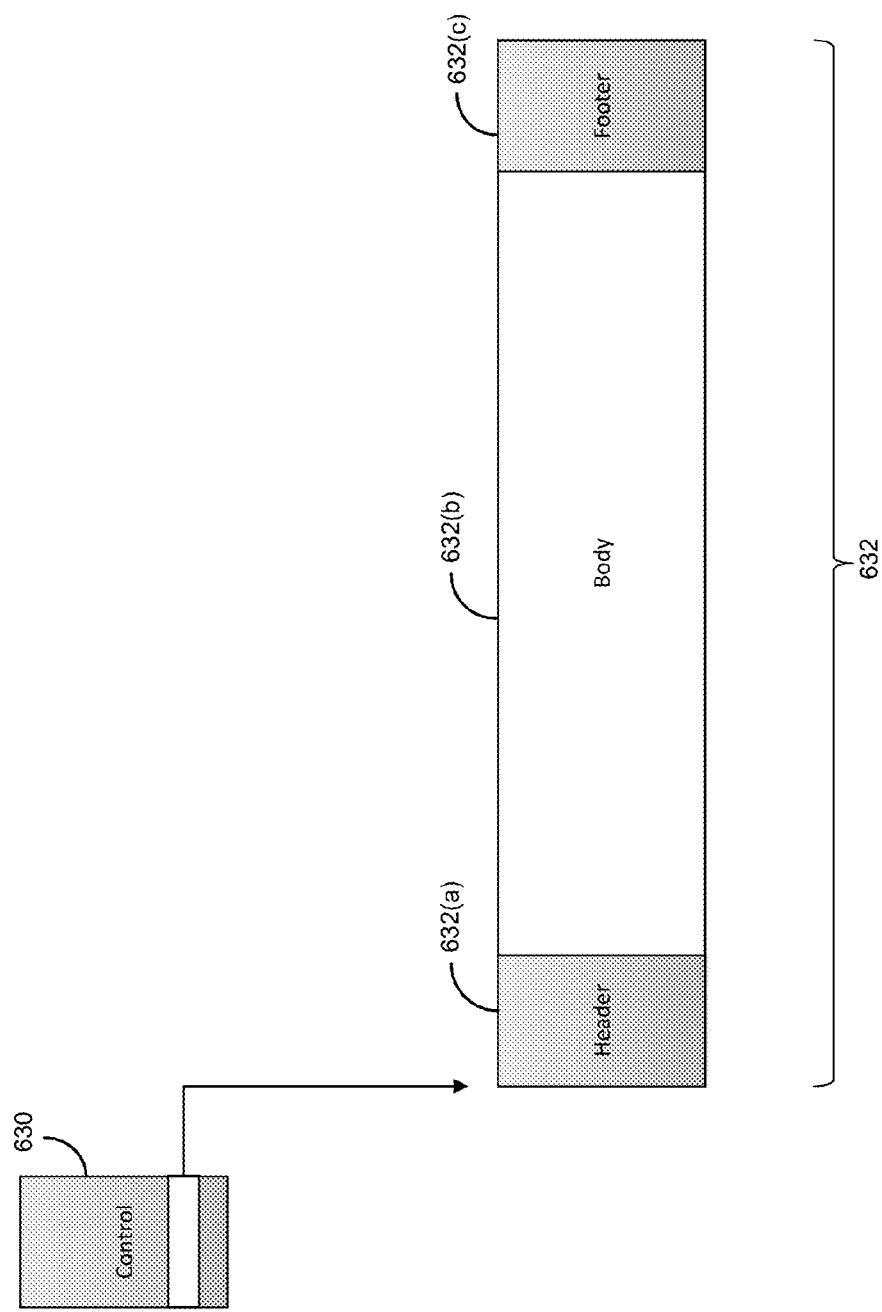
FIG. 6B is a block diagram of an example of an individual control portion maintained in a virtual buffer pool on a symmetric, volatile main memory component and the database block stored on an asymmetric, non-volatile memory component to which the control portion corresponds.

FIG. 6B is a block diagram of an example of an individual control portion 630 maintained in a virtual buffer pool (not illustrated) on a symmetric, volatile main memory component (not illustrated) and its corresponding database block 632 stored on an asymmetric, non-volatile memory component (not illustrated). The database block 632 that resides on the computer system's asymmetric, non-volatile memory component is organized into a header portion 632(*a*), a body portion 632(*b*), and a footer portion 632(*c*). In some implementations, header portion 632(*a*) may store information about the type of the database block 632 and/or one or more index structures for the database block 632, body portion 632(*b*) may store one or more records and/or one or more log entries, and footer portion 632(*c*) may store one or more index structures for the database block 632 and/or free space information for the database block 632. Meanwhile, control portion 630, which is maintained in the virtual buffer pool of the symmetric, volatile main memory component, stores information about its corresponding database block 632 that resides in the asymmetric, non-volatile memory component. In particular, control portion 630 includes a pointer to the virtual address that has been mapped to the physical address of its corresponding database block on the asymmetric, non-volatile memory component 614. In addition, control portion 630 may include other fields such as a database block ID for the database block 632 to which it corresponds, lock objects used for synchronization, reference counts, and status flags, which may be used by the buffer pool manager and other database modules accessing the control portion 630.

Referring again to FIG. 6A, in contrast to virtual buffer pool 606 which does not store copies of database blocks, buffer pool 618 includes a number of individual buffers 622, each of which temporarily stores or is allocated to temporarily store copies of database blocks that reside on one or both of asymmetric, non-volatile memory component 614 and block storage device 616. In addition to storing or being allocated to store a copy of a database block, each buffer 622 in buffer pool 618 also includes or is allocated to include a control portion that stores information about the copy of the database block stored in the buffer 622.

Buffer pool manager module 608 of database application 602 manages a collection of volatile main memory resources and services requests to access database blocks issued by other higher layer modules 612 of database application 602. More particularly, the other modules 612 of database application 602 perform random direct memory accesses to database blocks, and the buffer pool manager 608 is responsible for ensuring that the requested database blocks are represented in virtual buffer pool 606 or present in buffer pool 618 so that these access requests can be satisfied.

To support direct access by higher layer database application modules 612 to the database blocks residing in the asymmetric, non-volatile asymmetric memory component 614, buffer pool manager 608 maintains a map 624 of database blocks that associates the physical addresses of database blocks stored on asymmetric, non-volatile memory component 614 with addresses in the virtual address space of the database application 602. This association may be accomplished using, for example, the memory-mapped I/O mechanism described above, whereby portions of files residing on a File System stored on one or more non-volatile components are mapped into an application address space using OS interfaces. The mapping to a batch of database blocks residing on the non-volatile asymmetric memory component may be created upon initial access, and may be reused for servicing requests for any of the database blocks in the batch. When a database block is represented in virtual buffer pool 606 by a control portion 620, the control portion 620 includes a pointer to the virtual address that has been mapped to the physical address of its corresponding database block on the asymmetric, non-volatile memory component 614.

Requests by higher layer database application modules 612 for read accesses on database blocks stored in asymmetric, non-volatile memory component 614 may be handled completely (or primarily) at the hardware level, relying on the ability of asymmetric, non-volatile memory component 614 to respond to machine instructions executing on the CPU execution engines of the computer system 600 and to interact with the MMU and memory controller components of the computer system 600.

In contrast to requests by higher layer database application modules 612 for read accesses on database blocks stored in asymmetric, non-volatile memory component 614, requests by higher layer database application modules 612 for write accesses to memory-mapped database blocks stored in non-volatile asymmetric memory component 614 are trapped by the OS layer, which satisfies the write access requests by invoking the device driver module associated with asymmetric, non-volatile memory component 614 to issue block write operations against asymmetric, non-volatile memory component 614.

To improve efficiency, in some implementations, when the device driver module is invoked to satisfy a write request, in addition to or as an alternative to satisfying the write access request by issuing a block write operation, the device driver module may allocate a buffer 622 in buffer pool 618 on the symmetric, volatile main memory component 618, copy the contents of the database block into the allocated buffer 622, and perform the write operation against the database block copied into the buffer 622. Additional or subsequent write operations on the database block then can be performed directly using machine instructions, and modifications made to the database block copied into the buffer 622 later can be reconciled with the original database block residing in the asymmetric, non-volatile memory component 614. The reconciliation operation may be performed periodically, or as required for correct operation of the File System module interacting with the files storing the database contents. Decisions about whether a database block should be represented in virtual buffer pool 606 or copied into buffer pool 618 may be made by a decision module 626 of database application 602.

In some cases, a higher layer module 612 of database application 602 may need to determine which control portion in 620 in virtual buffer pool 606 corresponds to a particular database block residing on asymmetric, non-volatile memory component 614 to which the higher layer module 612 has been given access by buffer pool manager 608.

For example, when a higher layer module 612 is performing an update operation against a record in a particular database block, the higher layer module's view of this record corresponds to a virtual address pointer to the database block that holds this record. In order to ensure recovery from server crashes that may leave the update incomplete, the higher layer module 612 may log the previous state of the record to a special on-disk structure referred to as a recovery log. In addition to the contents of the record, the recovery log also may log other information about the record, such as, for example, the database table that it is a part of, the page in that table that the record resides on, etc. Rather than storing this information in the database block itself, the higher layer module 612 may store this information in designated fields within the control portion 620 that represents the database block, where it later may be accessed more efficiently than if this information had been stored in the database block itself. However, in order to determine the appropriate control portion 620 within which to store this information, the higher layer module 612 needs to know which control portion 620 represents the database block in virtual buffer pool 606.

Therefore, in order to support queries from buffer pool manager 608 as to which control portions 620 correspond to particular database blocks stored on asymmetric, non-volatile memory component 614, database application 602 may maintain an auxiliary data structure. In some implementations, this auxiliary structure may be a hash table-like structure, which stores an association between the starting virtual address of a database block and the control portion 620 currently in use to refer to this database block. Additionally or alternatively, this auxiliary structure may be a multi-level index structure, which may be traversed using the virtual address of a database block and whose contents store a pointer to the control portion 620 currently in use to refer to this database block.

Figure 6C:
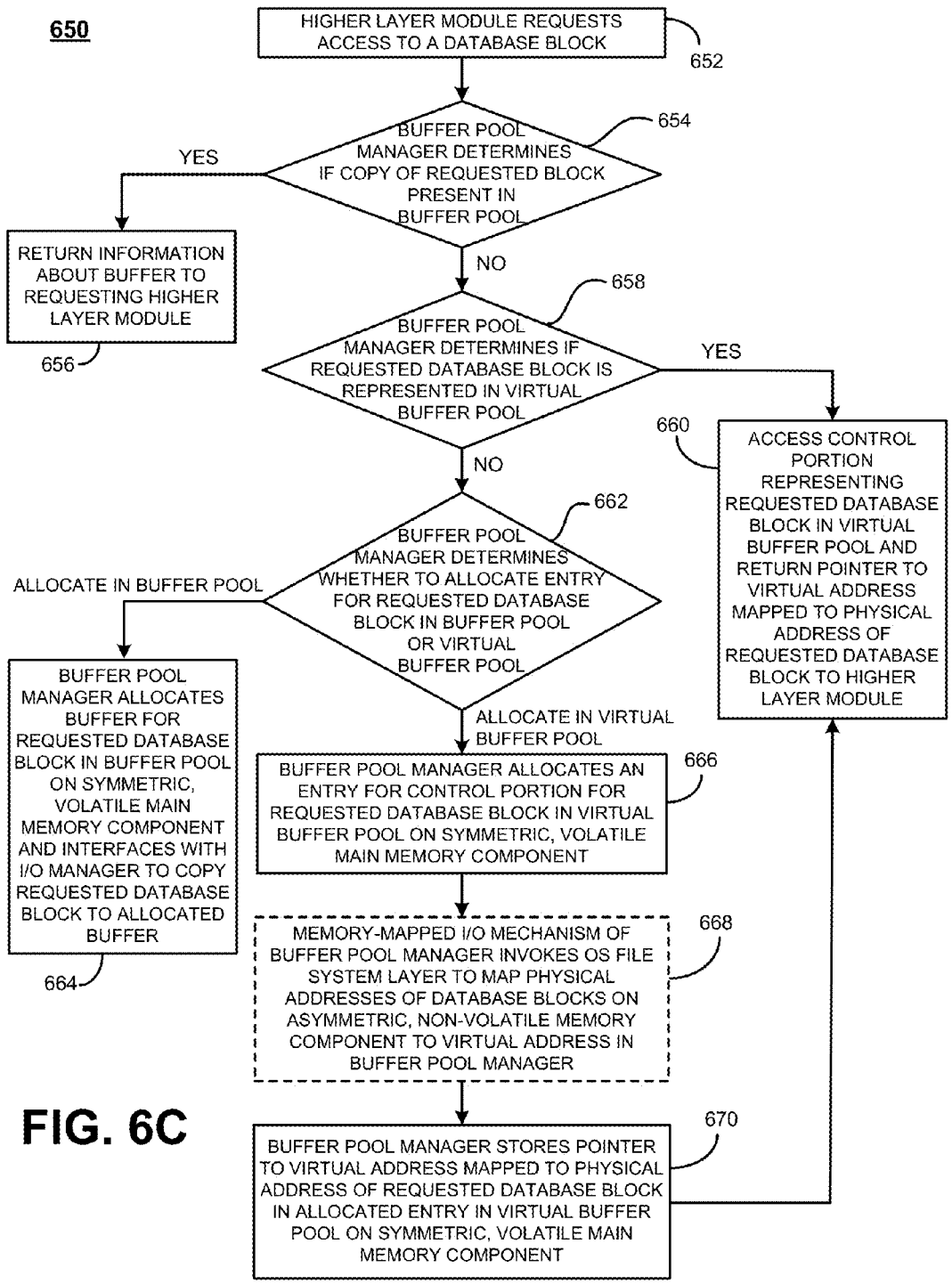
FIG. 6C is a flowchart of an example of a process through which a computer system services a request by a database module to access a database block.
Figure 6D:
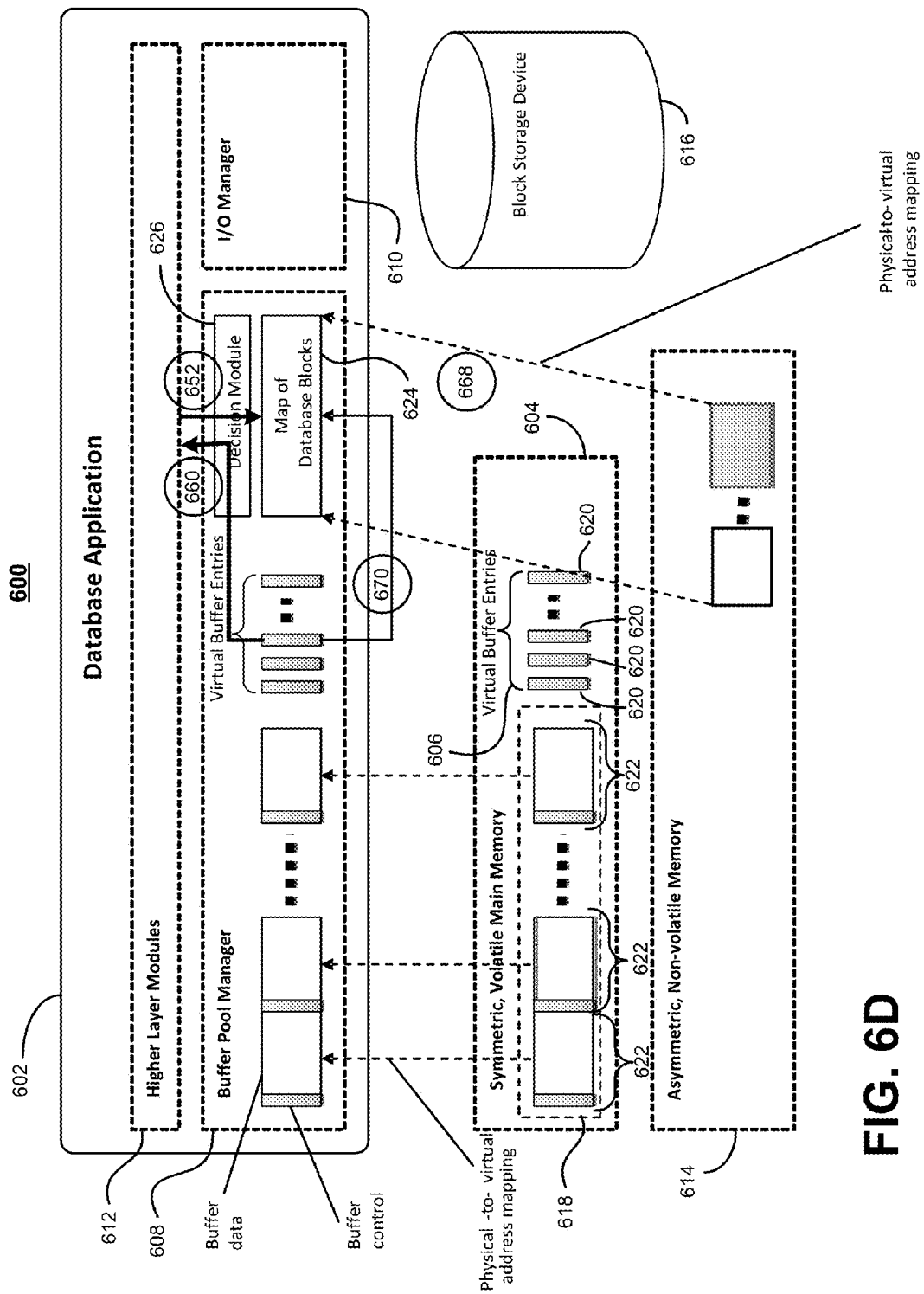

FIG. 6C is a flowchart 650 of an example of a process through which a computer system services a request by a database module to access a database block. FIG. 6D is a block diagram of the computer system 600 of FIG. 6A that illustrates pictorially how different components of the computer system 600 interact to perform the process of FIG. 6C.

The process begins when a higher layer database module 612 requests access to a database block (652). In some implementations, the higher layer module 612 may reference the database block to which it is requesting access by database block ID. In response to receiving the request to access the database block, the buffer pool manager 608 checks the internal state of the buffer pool 618 to determine if a copy of the requested database block already is present in one of the buffers 618 (654). In implementations where the higher layer module 612 references the requested database block by database block ID, the buffer pool manager 608 determines if a copy of the database block corresponding to the database block ID is present in one of the buffers 622.

If a copy of the requested database block already is present in buffer pool 618, the buffer pool manager 608 returns information about the buffer 622 within which the copy of the requested database block is stored to the requesting higher layer database module 612 (656), thereby enabling the requesting higher layer database module 612 to directly access the copy of the requested database block from the symmetric, volatile main memory component 604. For example, the buffer pool manager 608 may return, to the requesting higher layer module 612, a pointer to the virtual address in the database application's address space that corresponds to the physical address of the buffer 622 on the symmetric, main memory component 604 in which the copy of the requested database block is stored. In some implementations, this pointer may be stored in the control portion of the buffer 622 within which the copy of requested database block is stored. In such implementations, the buffer pool manager 608 may access this pointer by accessing the control portion of the buffer 622 within which the copy of the requested database block is stored.

If a copy of the requested database block is not already present in buffer pool 618, the buffer pool manager 608 determines if the requested database block already is represented in the virtual buffer pool 606 (658). In implementations where the higher layer module 612 references the requested database block by database block ID, the buffer pool manager 608 determines if the database block corresponding to the database block ID is represented by a control portion 620 in virtual buffer pool 606.

If the requested database block already is represented in the virtual buffer pool 606, the buffer pool manager 608 accesses the control portion 620 representing the requested database block in the virtual buffer pool 606 and returns, to the requesting higher layer module 612, a pointer to the virtual address that is mapped to the physical address of the requested database block (660). The requesting higher layer module 612 then may issue machine instructions against the returned virtual address, which the computer system's CPU(s) may translate into the appropriate physical address for the requested database block on the asymmetric, non-volatile memory component 614, thereby enabling the requesting higher layer module 612 to access the requested database block directly.

If the requested database block is not already present in buffer pool 618 and is not already represented in virtual buffer pool 606, decision module 626 in buffer pool manager 608 determines whether to allocate an entry for the requested database block in buffer pool 618 or virtual buffer pool 606 (662). In the event that the requested database block resides on block storage device 616, the decision module 626 in buffer pool manager 608 will decide to allocate an entry for the requested database block in buffer pool 618. Alternatively, if the requested database block resides in asymmetric, non-volatile memory component 614, the decision module 626 of buffer pool manager 608 may consider a variety of different factors before deciding whether to allocate an entry for the requested database block in buffer pool 618 or virtual buffer pool 606. As part of the decision-making process, the decision module 626 of buffer pool manager 608 may gather and analyze statistics regarding the database application's accessing of buffer pool 618 and virtual buffer pool 606 to determine when the requested database block should be represented in buffer pool 618 by copying its contents into a buffer 622 allocated in symmetric, volatile main memory component 604 and when the requested database block should be represented in virtual buffer pool 606 without also copying the requested database block to symmetric, volatile main memory component 604. Such statistics may include the contents of the database block; the type of database block; a prediction of the frequency with which the database block will accessed; a prediction of the percentage of block data that may be involved in an access; the ratio of read and write accesses that historically have been performed on the database block; a prediction of the ratio of read and write access that will be performed on the database block; and/or the types of queries that are being run against the database. These statistics that are considered by the buffer pool manager 608 when deciding whether to allocate an entry for the requested database block in buffer pool 618 or virtual buffer pool 606 may be stored in a data structure that records similar such statistics about multiple different database blocks. In some implementations, this data structure may be stored in symmetric, volatile main memory component 604.

If the decision module 626 of buffer pool manager 608 decides to allocate a buffer 622 for the requested database block in buffer pool 618, buffer pool manager 608 allocates a buffer 622 for the requested database block in buffer pool 618 on symmetric, volatile main memory component 604 and interfaces with I/O manager 610 and the OS File system layer to copy the requested database block to the allocated buffer 622 from its location on asymmetric, non-volatile memory component 614, or, in the event that the requested database block resides on block storage device 616, from its location on block storage device 616 (664).

If the decision module 626 of buffer pool manager 608 decides to allocate an entry for the requested database block in virtual buffer pool 606, buffer pool manager 608 allocates an entry for a control portion 620 of the requested database block in virtual buffer pool 606 on symmetric, volatile main memory component 604 (666).

Thereafter, if the physical addresses of the database blocks stored in the asymmetric, non-volatile memory component 614 have not yet been mapped into the virtual address space of database application 602, the buffer pool manager 608 invokes the memory-mapped I/O mechanism of the OS File System layer to map the physical addresses of the database blocks stored in the asymmetric, non-volatile memory component 614 to virtual addresses in buffer pool manager 608 (668). After the physical addresses of the database blocks stored in the asymmetric, non-volatile memory component 614 have been mapped into the virtual address space of database application 602, buffer pool manager 608 stores a pointer to the virtual address that is mapped to the physical address of the requested database block in the allocated entry in virtual buffer pool 606 on symmetric, volatile main memory component 604 (674).

After storing the pointer to the virtual address that is mapped to the physical address of the requested database block in the allocated entry in virtual buffer pool 606, buffer pool manager 608 then accesses the control portion 620 representing the requested database block in the virtual buffer pool 606 and returns a pointer, to the requesting higher layer module 612, to the virtual address that is mapped to the physical address of the requested database block (660).

After a higher layer module 612 of the database application 602 requests access to a database block that resides on asymmetric, non-volatile memory component 614 and that is represented in the virtual buffer pool 606 and receives a pointer to the virtual address that is mapped to the physical address of the requested database block in return, the higher layer module 612 of the database application 602 is able to access the database block directly from non-volatile asymmetric memory component 614 without first copying the database block to symmetric, volatile main memory component 604. In the case where the higher layer module 612 of the database application 602 requests to read data from the database block, the higher layer module 612 of the database application 602 may be able to read specific bytes or words of requested data from the database block without having to read the entire block because non-volatile asymmetric memory component 614 supports random access read operations.

Maintaining control portions 620 for database blocks represented in virtual buffer pool 606 without copying the actual database blocks to symmetric, volatile main memory component 604 may enable database application 602 to quickly access database blocks while at the same time saving database application 602 from incurring the overhead (e.g., time and processing power) associated with transferring the database blocks from asymmetric, non-volatile memory component 614 to symmetric, volatile main memory component 604. In addition, because the control portions 620 for database blocks generally tend to be relatively small compared to the actual database blocks, maintaining only the control portions 620 for the database blocks in virtual buffer pool 606 on symmetric, volatile main memory component 604 instead of both the control portions 620 and the actual database blocks may enable a larger virtual buffer pool 606 to be created in symmetric, volatile main memory component 604 than otherwise would be possible if both the control portions 626 and the database blocks were stored on symmetric, volatile main memory component 604.

In some implementations, a computer system that includes or has access to one or more asymmetric, non-volatile memory components and that is running a database application may maintain a virtual buffer pool for the database application in the computer system's symmetric, volatile main memory component without also maintaining a buffer pool for the database application in the computer system's symmetric, volatile main memory component. That is to say, in such implementations, control portions representing database blocks stored on the computer system's asymmetric, non-volatile memory component may be maintained on the computer system's symmetric, volatile main memory component without also copying any of the database blocks represented by the control portions to the symmetric, volatile main memory component. In alternative implementations, a computer system that includes or has access to one or more asymmetric memory components and that is running a database application may maintain a hybrid buffer pool for the database application in the computer system's symmetric, volatile main memory component in which some database blocks are represented by both control portions and copies of their contents while other database blocks are represented by control portions but not copies of their contents.

Figure 7:
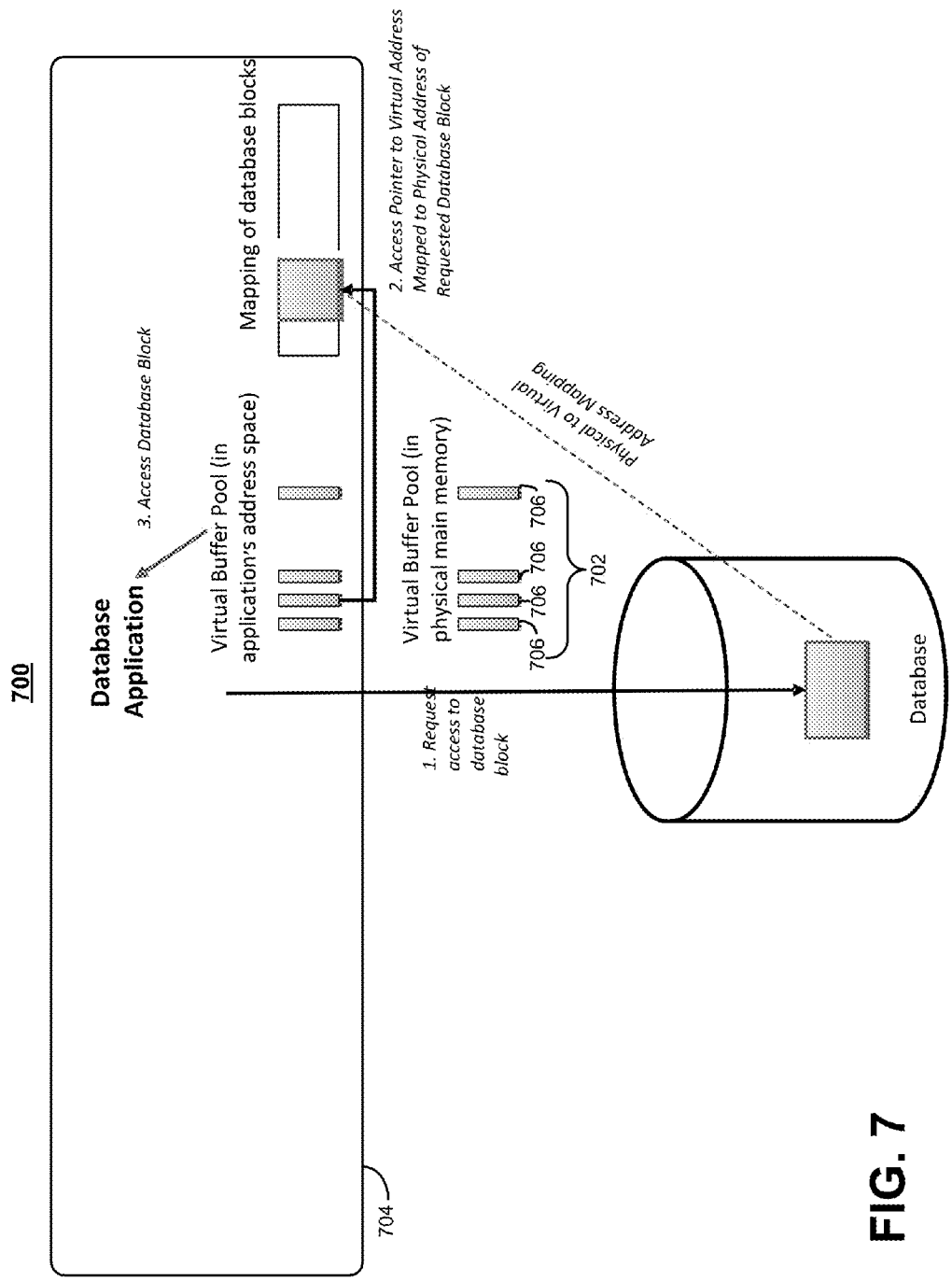
FIG. 7 is a block diagram of a computer system that illustrates an example of a virtual buffer pool implementation.

FIG. 7 is a block diagram of a computer system 700 that illustrates an example of a virtual buffer pool implementation. As illustrated in FIG. 7, a virtual buffer pool 702 is maintained by a database application 704 on a symmetric, volatile main memory component (not shown). The virtual buffer pool 702 includes control portions 706 that correspond to individual blocks of application data that themselves are stored by the database application 704 on an asymmetric, non-volatile memory component (not shown). The control portions 706 maintained in the virtual buffer pool 702 on the symmetric, volatile main memory component include pointers to the locations on the asymmetric, non-volatile memory component of the blocks of application data to which the control portions correspond. As described above, these pointers actually correspond to the virtual addresses in the database application's address space that have been mapped to the physical addresses of the database blocks on the asymmetric, non-volatile memory component in the CPUs' address space. Notably, copies of actual blocks of application data represented in the virtual buffer pool 702 by control portions 706 are not also stored in the virtual buffer pool 702. Rather, the blocks of application data remain stored in the non-volatile, asymmetric memory component without being copied to the main memory component.

In response to the database application 704 requesting access to (e.g., requesting to read data from) a block of application data, a determination is made as to whether the requested block of application data is represented by a control portion 706 in the virtual buffer pool 702 maintained on the symmetric, volatile main memory component. If the block of application data is represented by a control portion 706 in the virtual buffer pool 702, the control portion 706 corresponding to the block of application data is accessed, and the location of the block of application data on the non-volatile, asymmetric memory component is identified based on the pointer stored in the accessed control portion 706. The database application 702 then is provided with direct access to the block of application data from the non-volatile, asymmetric memory component. That is to say, the data base application 702 can access the block of application data directly from the non-volatile, asymmetric memory component without first copying the block of application data to the symmetric, volatile main memory component.

In contrast, if the requested block of application data is not represented by a control portion 706 in the virtual buffer pool 702 on the volatile main memory component, a portion of the virtual buffer pool 702 is allocated and initialized to include a control portion 706 that includes a pointer to the location of the block of application data on the non-volatile, asymmetric memory component. Thereafter, the database application 702 is provided with direct access to the block of application data on the asymmetric, non-volatile memory component.

Figure 8:
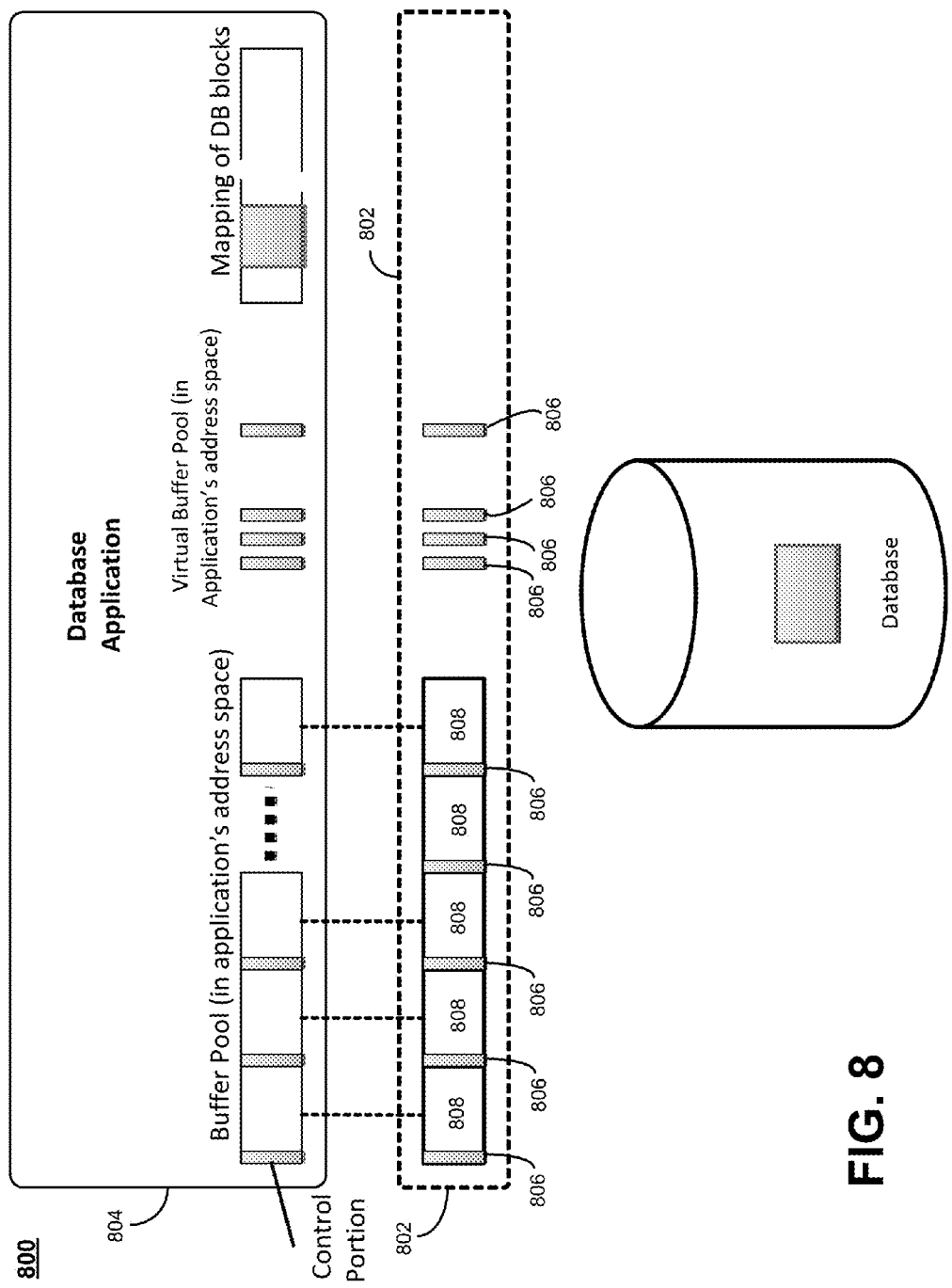
FIG. 8 is a block diagram of a computer system that illustrates an example of a hybrid buffer pool implementation.

FIG. 8 is a block diagram of a computer system 800 that illustrates an example of a hybrid buffer pool implementation. As illustrated in FIG. 8, a buffer pool 802 is maintained by a database application 804 on a symmetric, volatile main memory component (not shown). The buffer pool 802 includes control portions 806 that correspond to individual blocks of application data that are represented in the buffer pool. For some of the individual blocks of application data represented in the buffer pool, copies 808 of the individual blocks of application data are actually stored in the buffer pool 802 on the symmetric, volatile main memory component. For the remainder of the blocks of application data represented in the buffer pool 802, copies of the individual blocks of application data are not stored in the buffer pool 802 on the volatile main memory component. Rather, such blocks of application data are stored in the computer system's asymmetric, non-volatile memory component without being copied to the volatile main memory component, and the control portions 806 maintained in the buffer pool 802 that correspond to these blocks of application data include pointers to the locations of the blocks of application data on the computer system's asymmetric, non-volatile memory component. As described above, these pointers actually correspond to the virtual addresses in the database application's address space that have been mapped to the physical addresses of the database blocks on the asymmetric, non-volatile memory component in the CPUs' address space. In some implementations, the buffer pool 802 may be segregated into two distinguishable regions, a first region dedicated to storing both control portions 806 and copies 808 of the blocks of application data to which the control portions 806 correspond, and a second region dedicated to storing control portions 806 without also storing the blocks of application data to which the control portions 806 correspond. In such implementations, the first region may be referred to as the real buffer region and the second region may be referred to as the control-only region.

In response to the database application requesting access to (e.g., requesting to read data from) a block of application data, a determination is made as to whether the block of application data is represented by a control portion 806 in the buffer pool 802 that is maintained on the computer system's symmetric, volatile main memory component. If the block of application data is represented by a control portion 806 in the buffer pool 802, another determination is made as to whether a copy 808 of the block of application data itself is stored in the buffer pool 802 maintained on the computer system's symmetric, volatile main memory component. If a copy 808 of the block of application data is stored in the buffer pool 802, the database application 804 is provided with access to the copy 808 of the block of application data from the buffer pool 802 on the computer system's symmetric, volatile main memory component.

If the block of application data is represented by a control portion 806 in the buffer pool 802, but a copy of the block of application data is not stored in the buffer pool 802, the control portion 806 corresponding to the block of application data is accessed, and the location of the block of application data on the computer system's asymmetric, non-volatile memory component is identified. The database application 804 then may be provided with direct access to the block of application data from the asymmetric, non-volatile memory component without first copying the block of application data to the symmetric, volatile main memory component.

Additionally or alternatively, a determination may be made at this time as to whether the block of application data should be copied to a buffer in the buffer pool 802 maintained on the computer system's symmetric, volatile main memory component. In some implementations, this decision may be made by a decision module in a buffer pool manager layer of the database application. In addition, this determination may be based on a variety of factors including, for example, the contents of the block of application data, a prediction of the frequency with which the block of application data will be accessed in the future, a prediction of the percentage of the data stored in the block of application data to which the database application will request access at any one time, the occupancy of the buffer pool 802 (e.g., defined number of buffers occupied and/or percentage of buffers occupied) (including the occupancy of the real buffer region and the occupancy of the control-only region in implementations in which the buffer pool 802 is so divided), the type of the block of application data, the ratio of read and write accesses that historically have been performed on the database block, a prediction of the ratio of read and write accesses that will be performed on the database block, and/or the types of queries that are being run against the database.

If the requested block of application data is not represented by a control portion 806 in the buffer pool 802 on the computer system's symmetric, volatile main memory component, the requested block of application data is identified from its location either on the computer system's asymmetric, non-volatile memory component or a block storage device, and a portion of the buffer pool 802 is allocated and initialized to include a control portion 806 that includes a pointer to the location of the block of application data on the computer system's non-volatile, asymmetric memory component or the computer system's block storage device.

In addition, a determination may be made as to whether or not the requested block of application data itself should be copied to the computer system's symmetric, volatile main memory component. This determination may be based on a variety of factors including, for example, the contents of the block of application data, a prediction of the frequency with which the block of application data will be accessed in the future, a prediction of the percentage of the data stored in the block of application data to which the database application will request access at any one time, the occupancy of the buffer pool 802 (including the occupancy of the full buffer region and the occupancy of the control-only region in implementations in which the buffer pool 802 is so divided), the type of the block of application data, the ratio of read and write accesses that historically have been performed on the database block, a prediction of the ratio of read and write accesses that will be performed on the database block, and/or the types of queries that are being run against the database.

In one example, the requested block of application data may be accessed to determine the type of the block of application data. If the requested block of application data is determined to be an index block, the requested block of application data may be copied to the computer system's symmetric, volatile main memory component. In contrast, if the requested block of application data is determined to be a data block, the requested block of application data may be maintained on the computer system's asymmetric, non-volatile memory component without copying the requested block of application data to the computer system's symmetric, volatile main memory component.

Additionally or alternatively, the frequency with which the database application 804 will request access to the block of application data may be predicted, and, if the predicted frequency with which the database application 804 will request access to the block of application data is equal to or greater than a threshold value, the requested block of application data may be copied to the computer system's symmetric, volatile main memory component. In contrast, if the predicted frequency with which the database application 804 will request access to the block of application data is less than the threshold value, the requested block of application data may be maintained on the computer system's asymmetric, non-volatile memory component without copying the requested block of application data to the computer system's symmetric, volatile main memory component.

Similarly, the percentage of (or an average percentage of) the data stored in the block of application data to which the database application 804 will request access at any given time may be predicted, and, if the predicted percentage of the block of application data to which the database application 804 will request access is equal to or greater than a threshold value, the requested block of application data may be copied to the computer system's symmetric, volatile main memory component. In contrast, if the predicted percentage of the block of application data to which the database application 804 will request access is less than the threshold value, the requested block of application data may be maintained in the computer system's asymmetric, non-volatile memory component without copying the requested block of application data to the computer system's symmetric, volatile main memory component.

For example, in one implementation, the computer system's asymmetric, non-volatile memory component may be configured such that it takes the database application 804 approximately twice as long to access data from the computer system's asymmetric, non-volatile memory component as it does for the database application 804 to access data from the computer system's symmetric, volatile main memory component. In such an implementation, the threshold value may be 50%, and the requested block of application data may be copied to the computer system's symmetric, volatile main memory component if the predicted percentage of the data stored in the block of application data to which the database application will request access is equal to or greater than 50%.

In some implementations, a decision about whether a request to access a block of application data is processed by copying the requested block of application data to a buffer on the computer system's symmetric, volatile main memory component or through the virtual buffer pool only may be made when the requested block of application data has not already been copied to a buffer on the computer system's symmetric, volatile main memory component. In other implementations, this decision may be made even when the requested block of application data already has been copied to a buffer on the computer system's symmetric, volatile main memory component. In such implementations, a block of application data that has been copied into a buffer on the computer system's symmetric, volatile main memory component may be removed from the buffer in favor of representing the block of application data by only a control portion instead of both a control portion and a copy of the block of application data.

Figure 9:
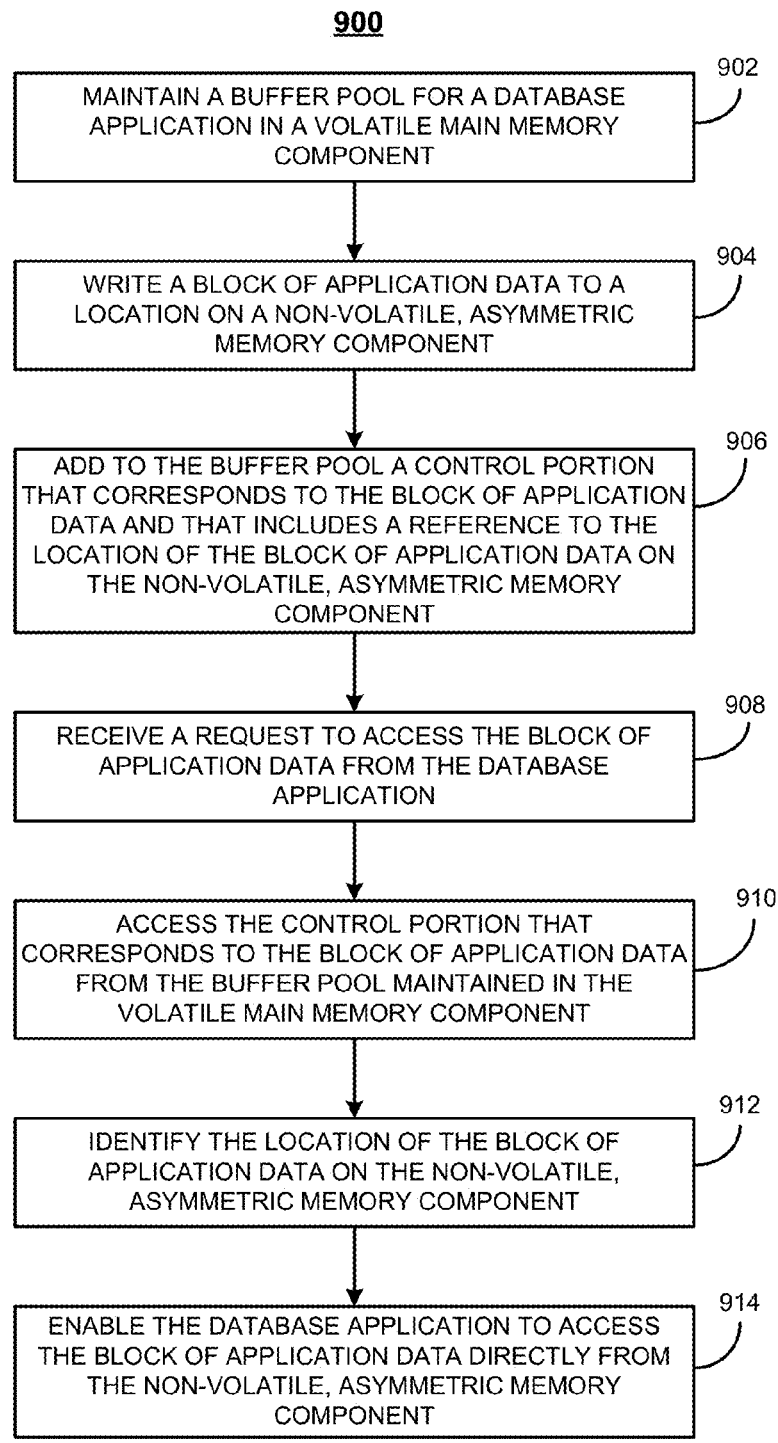
FIG. 9 is a flowchart of an example of a process for facilitating access to data by a database application.

FIG. 9 is a flowchart 900 of an example of a process for facilitating access to data by a database application. As illustrated in FIG. 9, a buffer pool for the database application is maintained on a symmetric, volatile main memory component of a computer system (902). At some point, a block of application data is written by the database application to a location on a non-volatile, asymmetric memory component of the computer system (904). Thereafter, a control portion that corresponds to the block of application data and that includes a reference to the location of the block of application data on the computer system's asymmetric, non-volatile memory component is added to the buffer pool on the computer system's symmetric, volatile main memory component without also copying the block of application data to the buffer pool on the computer system's symmetric, volatile main memory component (906). The reference to the location of the block of application data on the asymmetric, non-volatile memory component may be a virtual address or a physical address. In the case where the reference to the location of the block of application data on the asymmetric, non-volatile memory component is a virtual address, the block of application data may have been previously mapped into the address space of the database application. In some implementations, the control portion may be added to the buffer pool in response to a request from the database application to access the block of application data.

Eventually, the database application requests access to the block of application data (908). In response to the database application requesting access to the block of application data, the control portion that corresponds to the block of application data is accessed (910), the location of the block of application data on the asymmetric, non-volatile memory component is determined based on the reference to the block of application data stored within the control portion (912), and the database application is provided with access to the block of application data directly from the non-volatile, asymmetric memory component without first copying the block of application data to the volatile main memory component (914).

The systems and techniques described above are not limited to any particular hardware or software configuration. Rather, they may be implemented using hardware, software, or a combination of both. In addition, the methods and processes described may be implemented as computer programs that are executed on programmable computers comprising at least one processor and at least one data storage system. The computer programs may be implemented in a high-level compiled or interpreted programming language, or, additionally or alternatively, the computer programs may be implemented in assembly or other lower level languages, if desired. Such computer programs typically will be stored on computer-readable storage media or devices (e.g., CD-ROM, RAM, or magnetic disk). When read into a processor of a computer and executed, the instructions of the programs may cause a programmable computer to carry out the various operations described above.

A number of implementations have been described. Nevertheless, it will be understood that various modifications and implementations may be made. For example, in some implementations, a virtual buffer pool may store not only control portions representing corresponding database blocks, but the virtual buffer pool also may store subsets of less than all of the data portions of their corresponding database blocks. In such implementations, when the buffer pool manager receives a request for a database block residing in an asymmetric, non-volatile memory component and chooses to represent this database block in a virtual buffer in symmetric, volatile main memory, the control portion representing the database block is pointed to the virtual address corresponding to the mapped region of the file and the desired subset of the data portion of the database block is copied into the virtual buffer pool entry. In some such implementations, the subset of the data portion of the database block that is copied into the virtual buffer pool entry corresponds to the header and/or footer portions of the database block. Maintaining a subset of the data portion of the database block in the virtual buffer pool entry allocated in the symmetric, volatile main memory component may enable the database application to perform certain operations more efficiently because of latency differences between memory reads against symmetric, volatile main memory and asymmetric, non-volatile memory components.

Furthermore, useful results may be achieved if steps of the disclosed techniques are performed in a different order and/or if components in the disclosed systems are combined in a different manner and/or replaced or supplemented by other components.

What is claimed is:

1. A computer-implemented method of facilitating access to stored data by a database application, the method comprising:

maintaining, in a volatile main memory component, a buffer pool for a database application;

writing a block of application data to a location on a non-volatile, asymmetric memory component;

adding, to the buffer pool maintained in the volatile main memory component, a control portion that corresponds to the block of application data and that includes a reference to the location of the block of application data on the non-volatile, asymmetric memory component;

receiving, from the database application, a request to access the block of application data; and in response to receiving the request to access the block of application data:

accessing, from the buffer pool maintained in the volatile main memory component, the control portion that corresponds to the block of application data, based on accessing the control portion that corresponds to the block of application data from the buffer pool maintained in the volatile main memory component, identifying the location of the block of application data on the nonvolatile, asymmetric memory component, and based on identifying the location of the block of application data on the nonvolatile, asymmetric memory component, enabling the database application to access the block of application data directly from the non-volatile, asymmetric memory component, wherein the database application is configured to support migration of application data between the volatile memory component and the nonvolatile memory component and adding the control portion corresponding to the block of application data to the buffer pool maintained in the volatile main memory component includes adding the control portion corresponding to the block of application data to the buffer pool maintained in the volatile main memory component without adding the entire block of application data to the buffer pool maintained in the volatile main memory component.

2. The method of claim 1 wherein: the block of application data includes a header, a body, and a footer; and adding the control portion corresponding to the block of application data to the buffer pool maintained in the volatile main memory component without adding the entire block of application data to the buffer pool maintained in the volatile main memory component includes adding the header of the block of application data to the buffer pool maintained in the volatile main memory component without adding the body of the block of application data to the buffer pool maintained in the volatile main memory component.

3. The method of claim 2, wherein adding the header of the block of application data to the buffer pool maintained in the volatile main memory component without adding the body of the block of application data to the buffer pool maintained in the volatile main memory component includes adding the footer of the block of application data to the buffer pool maintained in the volatile main memory component without adding the body of the block of application data to the buffer pool maintained in the volatile main memory component.

4. The method of claim 2 wherein:
the block of application data includes a header, a body, and a footer; and
adding the control portion corresponding to the block of application data to the buffer pool maintained in the volatile main memory component without adding the entire block of application data to the buffer pool maintained in the volatile main memory component includes adding the footer of the block of application data to the buffer pool maintained in the volatile main memory component without adding the body of the block of application data to the buffer pool maintained in the volatile main memory component.

5. The method of claim 1 wherein adding the control portion corresponding to the block of application data to the buffer pool maintained in the volatile main memory component includes adding the control portion corresponding to the block of application data to the buffer pool maintained in the volatile main memory component without adding any of the block of application data to the buffer pool maintained in the volatile main memory component.

6. The method of claim 1 wherein:
maintaining the buffer pool in a volatile main memory component includes maintaining the buffer pool in a dynamic random access memory component;
adding a control portion that corresponds to the block of application data to the buffer pool maintained in the volatile main memory component includes adding the control portion to the dynamic random access memory component; and
accessing the control portion that corresponds to the block of application data from the buffer pool maintained in the volatile main memory component includes accessing the control portion that corresponds to the block of application data from the dynamic random access memory component.

7. The method of claim 1 wherein:
writing the block of application data to a location on a non-volatile, asymmetric memory component includes writing the block of application data to a location on a NOR flash memory component; and
enabling the database application to access the block of application data directly from the non-volatile, asymmetric memory component includes enabling the database application to access the block of application data directly from the NOR flash memory component.

8. The method of claim 1 wherein:
writing the block of application data to a location on a non-volatile, asymmetric memory component includes writing the block of application data to a location on a Phase Change Memory component; and
enabling the database application to access the block of application data directly from the non-volatile, asymmetric memory component includes enabling the database application to access the block of application data directly from the Phase Change Memory component.

9. The method of claim 1 wherein enabling the database application to access the block of application data directly from the non-volatile, asymmetric memory component includes enabling the database application to access the block of application data from the non-volatile, asymmetric memory component without first copying the block of application data into the volatile main memory component.

10. The method of claim 1 further comprising:
maintaining an auxiliary data structure that records relationships between multiple blocks of application data stored on the non-volatile, asymmetric main memory component and corresponding control portions in the buffer pool maintained on the volatile main memory component that represent the multiple blocks of application data in the buffer pool;
after enabling the database application to access the block of application data directly from the non-volatile, asymmetric memory component, receiving, from the database application, a request to identify the control portion in the buffer pool that represents the block of application data;
in response to receiving the request to identify the control portion in the buffer pool that represents the block of application data, accessing the auxiliary data structure;
based on accessing the auxiliary data structure, identifying the control portion that represents the block of application data in the buffer pool; and
informing the database application of the control portion that represents the block of application data in the buffer pool.

11. The method of claim 10 wherein the auxiliary data structure is a hash table such that:

maintaining an auxiliary data structure that records relationships between multiple blocks of application data stored on the non-volatile, asymmetric main memory component and corresponding control portions in the buffer pool maintained on the volatile main memory component that represent the multiple blocks of application data in the buffer pool includes maintaining a hash table that records relationships between multiple blocks of application data stored on the non-volatile, asymmetric main memory component and corresponding control portions in the buffer pool maintained on the volatile main memory component that represent the multiple blocks of application data in the buffer pool; and accessing the auxiliary data structure includes accessing the hash table.

12. The method of claim 10 wherein the auxiliary data structure is a multi-level index structure such that:

maintaining an auxiliary data structure that records relationships between multiple blocks of application data stored on the non-volatile, asymmetric main memory component and corresponding control portions in the buffer pool maintained on the volatile main memory component that represent the multiple blocks of application data in the buffer pool includes maintaining a multi-level index structure that records relationships between multiple blocks of application data stored on the non-volatile, asymmetric main memory component and corresponding control portions in the buffer pool maintained on the volatile main memory component that represent the multiple blocks of application data in the buffer pool; and accessing the auxiliary data structure includes accessing the multi-level index structure.

13. The method of claim 1 wherein:

identifying the location of the block of application data on the non-volatile, asymmetric memory component includes accessing a pointer to a virtual address in the database application's address space that is mapped to a physical address for the block of application data on the non-volatile, asymmetric memory component; and enabling the database application to access the block of application data directly from the non-volatile, asymmetric memory component includes passing the pointer to the virtual address to the database application.

14. The method of claim 1 wherein:

multiple, equal-sized blocks of application data are stored on the non-volatile, asymmetric memory component, each of the multiple blocks of application data including no more than a fixed number of bytes;

the block of application data is equal in size to the multiple blocks of application data and includes nor more than the fixed number of bytes; and enabling the database application to access the block of application data directly from the non-volatile, asymmetric memory component includes enabling the database application to access one or more specific bytes of the block application data directly from the non-volatile, asymmetric memory component without accessing all of the bytes of the block of application data.

15. The method of claim 1 wherein:

adding, to the buffer pool maintained in the volatile main memory component, a control portion that corresponds to the block of application data and that includes a reference to the location of the block of application data on the non-volatile, asymmetric memory component includes adding, to the buffer pool maintained in the volatile main memory component, a control portion that corresponds to the block of application data and that includes a reference to a virtual address of the block of application data; and identifying the location of the block of application data on the non-volatile, asymmetric memory component includes converting the reference to the virtual address of the block of application data into a reference to a physical address of the block of application data on the non-volatile, asymmetric memory component.

16. The method of claim 1 further comprising:

after enabling the database application to access the block of application data directly from the non-volatile, asymmetric memory component, determining a current measure of occupancy of the buffer pool maintained in the volatile main memory component;

comparing the determined current measure of occupancy of the buffer pool to a predefined value;

based on results of comparing the determined current measure of occupancy of the buffer pool to the predefined value, determining whether to add the block of application data to the buffer pool maintained in the volatile main memory component;

responsive to a determination to add the block of application data to the buffer pool maintained in the volatile main memory component:

adding the block of application data to the buffer pool maintained in the volatile main memory component, and updating the control portion that corresponds to the block of application data to reflect the addition of the block of application data to the buffer pool maintained in the volatile main memory component.

17. The method of claim 1 wherein:

receiving a request to access the block of application data includes receiving a request from the database application to read data from the block of application data; and enabling the database application to access the block of application data directly from the non-volatile, asymmetric memory component includes enabling the database application to read data from the block of application data directly from the non-volatile, asymmetric memory component.

18. The method of claim 17 wherein:

the block of application data includes multiple bytes of application data;

receiving a request from the database application to read from the block of application data includes receiving a request from the database application to read less than all of the bytes of the block of application data; and enabling the database application to read the block of application data directly from the non-volatile, asymmetric memory component includes enabling the database application to read less than all of the bytes of the block of application data directly from the non-volatile, asymmetric memory component.

19. A computer-readable storage medium having embodied thereon a computer program, the computer program including instructions that, when executed by a computer, cause the computer to:

maintain, in a volatile main memory component, a buffer pool for a database application;

write a block of application data to a location on a non-volatile, asymmetric memory component;

add, to the buffer pool maintained in the volatile main memory component, a control portion that corresponds to the block of application data and that includes a reference to the location of the block of application data on the non-volatile, asymmetric memory component;

receive, from the database application, a request to access the block of application data; and in response to receiving the request to access the block of application data:

access, from the buffer pool maintained in the volatile main memory component, the control portion that corresponds to the block of application data, based on accessing the control portion that corresponds to the block of application data from the buffer pool maintained in the volatile main memory component, identify the location of the block of application data on the non-volatile, asymmetric memory component, and based on identifying the location of the block of application data on the non-volatile, asymmetric memory component, enable the database application to access the block of application data directly from the non-volatile, asymmetric memory component, wherein the database application is configured to support migration of application data between the volatile memory component and the nonvolatile memory component and adding the control portion corresponding to the block of application data to the buffer pool maintained in the volatile main memory component includes adding the control portion corresponding to the block of application data to the buffer pool maintained in the volatile main memory component without adding the entire block of application data to the buffer pool maintained in the volatile main memory component.

* * * * *